(12) United States Patent
Chung et al.

(10) Patent No.: US 11,706,953 B2
(45) Date of Patent: Jul. 18, 2023

(54) DISPLAY DEVICE

(71) Applicant: Samsung Display Co., Ltd., Yongin-si (KR)

(72) Inventors: Jin Koo Chung, Suwon-si (KR); Beohm Rock Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 69 days.

(21) Appl. No.: 16/954,681

(22) PCT Filed: May 24, 2019

(86) PCT No.: PCT/KR2019/006277
§ 371 (c)(1),
(2) Date: Jun. 17, 2020

(87) PCT Pub. No.: WO2020/071611
PCT Pub. Date: Apr. 9, 2020

(65) Prior Publication Data
US 2020/0357871 A1    Nov. 12, 2020

(30) Foreign Application Priority Data
Oct. 5, 2018 (KR) .................. 10-2018-0118768

(51) Int. Cl.
*H10K 59/124* (2023.01)
*H04N 23/54* (2023.01)
(Continued)

(52) U.S. Cl.
CPC ........... *H10K 59/124* (2023.02); *H04N 23/54* (2023.01); *H10K 50/844* (2023.02); *H10K 59/126* (2023.02); *H10K 59/38* (2023.02)

(58) Field of Classification Search
CPC ............. H01L 27/3227; H01L 27/3258; H01L 27/3234; H01L 27/3272; H01L 27/322;
(Continued)

(56) References Cited

U.S. PATENT DOCUMENTS

| 8,659,218 B2 | 2/2014 | Hwang et al. |
| 8,994,266 B2 | 3/2015 | Jung et al. |

(Continued)

FOREIGN PATENT DOCUMENTS

| CN | 105070720 | 11/2015 |
| JP | 2018-032021 | 3/2018 |

(Continued)

OTHER PUBLICATIONS

International Search Report dated Sep. 24, 2019, in International Application No. PCT/KR2019/006277.

*Primary Examiner* — Vongsavanh Sengdara
(74) *Attorney, Agent, or Firm* — H.C. Park & Associates, PLC

(57) ABSTRACT

A display device includes a display panel and an optical member. The display panel includes a lower substrate and an upper substrate. The display panel forms a light-transmitting area and a display area near the light-transmitting area. The optical member is adjacent to a rear surface of the display panel and overlaps with a portion corresponding to the light-transmitting area. The display area includes a thin film transistor and an organic light emitting element configured to receive a current from the thin film transistor. The light-transmitting area does not include a metal layer, which is disposed in the display area. The upper substrate and the lower substrate do not have a through-hole structure in the light-transmitting area.

19 Claims, 22 Drawing Sheets

(51) Int. Cl.
*H10K 50/844* (2023.01)
*H10K 59/38* (2023.01)
*H10K 59/126* (2023.01)

(58) Field of Classification Search
CPC ............ H01L 51/5275; H01L 51/5256; H01L 51/5253; H01L 51/5281; H01L 51/5284; H01L 5/2257
See application file for complete search history.

(56) References Cited

U.S. PATENT DOCUMENTS

| | | | |
|---|---|---|---|
| 9,277,172 | B2 | 3/2016 | Choi |
| 9,337,211 | B2 | 5/2016 | Kim et al. |
| 9,647,045 | B2 | 5/2017 | Jung et al. |
| 9,791,471 | B2 | 10/2017 | Qiu et al. |
| 9,905,629 | B2 | 2/2018 | Kim et al. |
| 9,997,738 | B2 | 6/2018 | Choi et al. |
| 10,153,460 | B2 | 12/2018 | Isaka et al. |
| 10,332,947 | B2 | 6/2019 | Kim et al. |
| 10,510,813 | B2 | 12/2019 | Son et al. |
| 2014/0192515 | A1* | 7/2014 | Kim .................. G02F 1/133512 362/97.1 |
| 2016/0126494 | A1* | 5/2016 | Jung .................... H10K 59/121 438/23 |
| 2017/0237038 | A1* | 8/2017 | Kim ........................ H10K 77/10 257/40 |
| 2017/0288004 | A1* | 10/2017 | Kim ........................ H10K 77/10 |
| 2018/0089485 | A1* | 3/2018 | Bok ........................ G06F 3/0412 |
| 2018/0090300 | A1* | 3/2018 | Zhao .................... C23C 16/4404 |
| 2018/0173349 | A1* | 6/2018 | Cho .......................... G06F 3/042 |

FOREIGN PATENT DOCUMENTS

| | | |
|---|---|---|
| KR | 10-2012-0045479 | 5/2012 |
| KR | 10-1156435 | 6/2012 |
| KR | 10-1462351 | 11/2014 |
| KR | 10-2014-0147590 | 12/2014 |
| KR | 10-2016-0053001 | 5/2016 |
| KR | 10-2017-0024182 | 3/2017 |
| KR | 10-2017-0059537 | 5/2017 |
| KR | 10-2017-0115177 | 10/2017 |
| KR | 10-2018-0026599 | 3/2018 |
| KR | 10-2018-0077953 | 7/2018 |
| TW | 201409681 | 3/2014 |

* cited by examiner (A)          (B)

FIG. 4

| Stacked structure | Active Area | Transparent Hole |
|---|---|---|
| TFT Insulating layer | N/O/N/O/N (Buffer SiNx/SiOx, GI1 SiOx, GI2 SiNx, ILD SiOx/SiNx) | N/O Interface removing |
| TFT Organic layer | Yes | No |
| OLED Organic layer | All (HIL/RGB/ETL/EIL) | Removing/△ |
| Cathode | Yes | No |
| CPL | Thick | Thin/△ |
| Filler | No | Yes/△ |

FIG. 5

| Items | Active Area | Transparent Hole | Transparency improvement level |
|---|---|---|---|
| TFT Insulating layer | N/O/N/O/N (Buffer SiNx/SiOx, GI1 SiOx, GI2 SiNx, ILD SiOx/SiNx) | N/O Interface removing | Stacked transparency ~6% |
| TFT Organic layer | Yes | No | Stacked transparency 6~10% |
| Cathode | Yes | No | Stacked transparency ~10% (Filling reference) |
| CPL | Thick | Thin | Stacked transparency ~10% |
| Filler | No | Yes | Stacked transparency ~10% |

DISPLAY DEVICE

CROSS-REFERENCE TO RELATED APPLICATIONS

This application is a National Stage Entry of International Application No. PCT/KR2019/006277, filed May 24, 2019, which claims priority to and the benefit of Korean Patent Application No. 10-2018-0118768, filed Oct. 5, 2018, each of which is hereby incorporated by reference for all purposes as if fully set forth herein.

BACKGROUND

Field

Exemplary embodiments generally relate to a display device, and, more particularly, to a display device having a light-transmitting area.

Discussion

Recently, as various portable electronic devices have included camera functions, use of a portable electronic device with a built-in camera function has been increasing at a faster rate than a case of separately carrying a camera.

Conventionally, since the camera is disposed outside the image display area of the electronic device, a space in which the electronic device can display the image is reduced. In recent years, however, structures in which the camera is disposed inside a display have been disclosed in, for example, U.S. Patent Application Publication No. 2016/0337570, entitled "CAMERA INCLUDED IN DISPLAY."

The above information disclosed in this section is only for understanding the background of the inventive concepts, and, therefore, may contain information that does not form prior art.

Summary

Some exemplary embodiments are capable of providing a display device of which transmittance of a light-transmitting area is high.

Additional aspects will be set forth in the detailed description which follows, and, in part, will be apparent from the disclosure, or may be learned by practice of the inventive concepts.

According to an aspect, a display device includes a display panel and an optical member. The display panel includes a lower substrate and an upper substrate. The display panel forms a light-transmitting area and a display area near the light-transmitting area. The optical member is adjacent to a rear surface of the display panel and overlaps with a portion corresponding to the light-transmitting area. The display area includes a thin film transistor and an organic light emitting element configured to receive a current from the thin film transistor. The light-transmitting area does not include a metal layer, which is disposed in the display area. The upper substrate and the lower substrate do not have a through-hole structure in the light-transmitting area.

In an exemplary embodiment, the display area may include a thin film transistor (TFT) insulating layer, a TFT organic layer, an upper electrode, and an organic passivation layer.

In an exemplary embodiment, the TFT insulating layer may include a buffer layer, a gate insulating layer, and an interlayer insulating layer. Two layers among the buffer layer, the gate insulating layer, and the interlayer insulating layer may extend into and contact one another in the light-transmitting area. The two layers may include a same material, the same material being a silicon oxide or a silicon nitride.

In an exemplary embodiment, the TFT insulating layer may include a buffer layer, a gate insulating layer, and an interlayer insulating layer. At least two layers among the buffer layer, the gate insulating layer, and the interlayer insulating layer may extend into the light-transmitting area. Each of the at least two layers in the light-transmitting area may be formed of only one of a silicon oxide and a silicon nitride.

In an exemplary embodiment, the TFT insulating layer may include a buffer layer, a gate insulating layer, and an interlayer insulating layer. Only one layer among the buffer layer, the gate insulating layer, and the interlayer insulating layer may extend into the light-transmitting area.

In an exemplary embodiment, the TFT organic layer may extend into the light-transmitting area, and the optical member may be an infrared camera.

In an exemplary embodiment, the display panel may include a polarizer, an adhesive layer, and a window. The polarizer may be disposed on the upper substrate. The adhesive layer may be disposed on the polarizer. The window may be disposed on the adhesive layer. The window may include an upper light blocking layer comprising an opening corresponding to a portion of the light-transmitting area.

In an exemplary embodiment, the polarizer may not be formed in the light-transmitting area.

In an exemplary embodiment, the display device may further include a lower light blocking layer including an opening corresponding to a portion of the light-transmitting area between the upper substrate and the lower substrate. The opening of the lower light blocking layer may be narrower than the opening of the upper light blocking layer.

In an exemplary embodiment, the display panel may include a color filter and an upper light blocking layer disposed on the upper substrate, an adhesive layer disposed on the color filter and the upper light blocking layer, and a window disposed on the adhesive layer. The upper light blocking layer may include an opening corresponding to a portion of the light-transmitting area.

In an exemplary embodiment, the display device may further include a lower light blocking layer including an opening corresponding to a portion of the light-transmitting area between the upper substrate and the lower substrate. The opening of the lower light blocking layer may be narrower than the opening of the upper light blocking layer.

In an exemplary embodiment, the display device may further include at least one of an air layer filled with air including nitrogen and a filling layer filled with a silicon-based organic material. The at least one of the air layer and the filling layer may be disposed between the upper substrate and the lower substrate.

In an exemplary embodiment, the display device may further include at least one of an air layer filled with air including nitrogen and a filling layer filled with a silicon-based organic material. The at least one of the air layer and the filling layer may be disposed between the window and the upper substrate.

In an exemplary embodiment, the light-transmitting area may be enclosed by the display area in a plan view.

In an exemplary embodiment, the display panel may further include an outer buffer area. In a plan view, the outer buffer area may enclose the light-transmitting area and the display area. In the plan view, the light-transmitting area may be partially enclosed by the display area. Part of the outer buffer area may extend between the display area and the light-transmitting area to separate the display area and the light-transmitting area from each other.

According to an aspect, a display device includes a display panel and an optical member. The display panel includes a light-transmitting area and a display area near the light-transmitting area. The optical member is adjacent to a rear surface of the display panel and overlaps with a portion corresponding to the light-transmitting area. The display area includes a thin film transistor and an organic light emitting element configured to receive a current from the thin film transistor. The organic light emitting element includes a pixel electrode, an organic emission layer, and an upper electrode. The light-transmitting area does not include either of the upper electrode and a metal layer disposed in the display area.

In an exemplary embodiment, the display panel may further include an encapsulation layer covering the thin film transistor and the organic light emitting element. The encapsulation layer may be configured to prevent moisture from permeating into the organic emission layer.

In an exemplary embodiment, the encapsulation layer may include a first encapsulation layer formed of a silicon nitride; a second encapsulation layer disposed on the first encapsulation layer, the second encapsulation layer being formed of an organic material; and a third encapsulation layer disposed on the second encapsulation layer, the third encapsulation layer being formed of a silicon nitride.

In an exemplary embodiment, the encapsulation layer may further include a refractive index buffer layer formed of a silicon nitride. The silicon nitride may include a silicon oxynitride. The refractive index buffer layer may be disposed between the first encapsulation layer and the second encapsulation layer, or between the second encapsulation layer and the third encapsulation layer.

In an exemplary embodiment, the third encapsulation layer may be formed of a silicon nitride including a silicon oxynitride having a refractive index less than 2.

According to various exemplary embodiments, as the transmittance of the light-transmitting area is high, there is a merit that efficiency of light incident to a sensor, such as a camera disposed at, adjacent to, or near the rear surface of the light-transmitting area is not decreased.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

FIG. 4 is a table summarizing a transmittance characteristic according to a stacked structure according to an exemplary embodiment.

FIG. 5 is a table showing a transmittance improvement of each stacked structure of FIG. 4 according to an exemplary embodiment.

DETAILED DESCRIPTION OF THE ILLUSTRATED EMBODIMENTS

Figure 1:
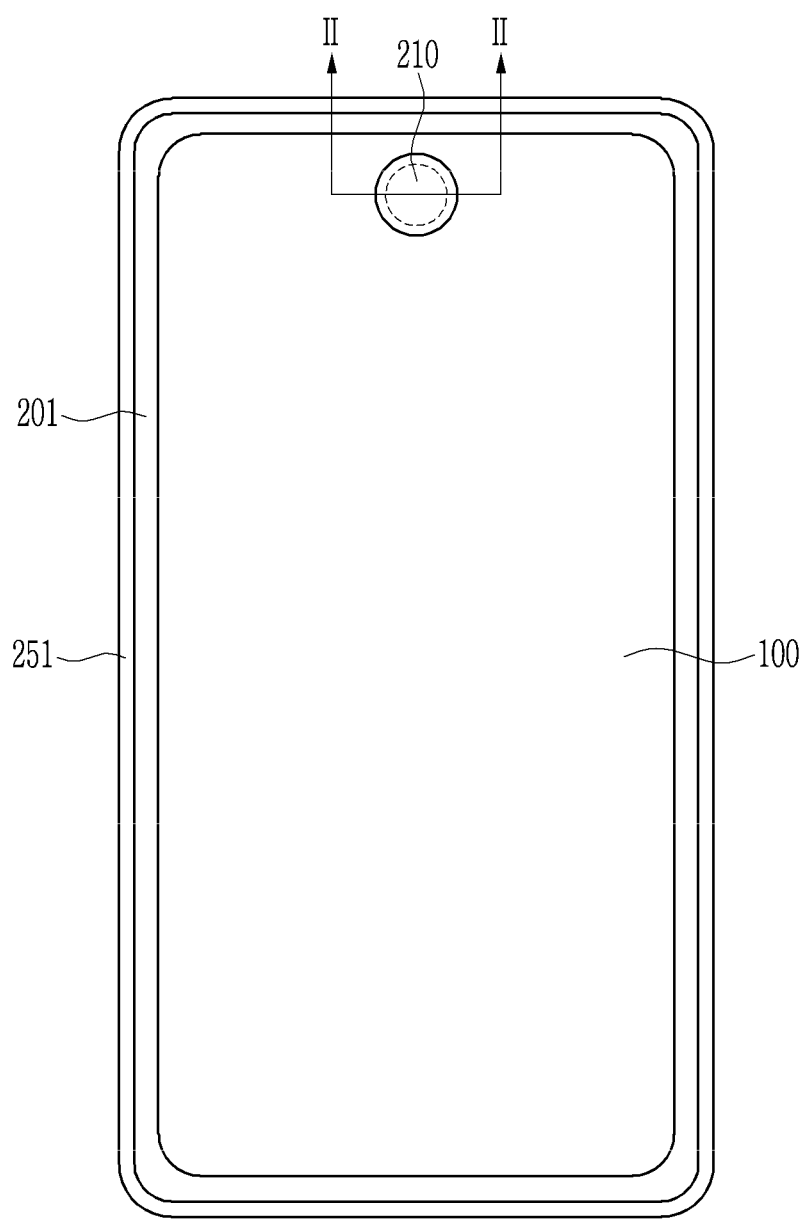
FIG. 1 is a top plan view of a display panel according to an exemplary embodiment.

Some inventive concepts will be described more fully hereinafter with reference to the accompanying drawings, in which various exemplary embodiments are shown. As those skilled in the art would realize, the described exemplary embodiments may be modified in various different ways, all without departing from the spirit and/or scope of the inventive concepts.

In order to clearly explain the inventive concepts, portions not directly related were omitted, and the same or similar reference numerals refer to the same or similar constituent elements throughout the disclosure.

In addition, the size and thickness of each configuration shown in the drawings are arbitrarily shown for better understanding and ease of description, but exemplary embodiments are not limited thereto. In the drawings, the thickness of layers, films, panels, regions, etc., are exaggerated for clarity. In the drawings, for better understanding and ease of description, the thicknesses of some layers and areas are exaggerated.

When an element, such as a layer, film, region, or substrate, is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

In addition, unless explicitly described to the contrary, the word "comprise" and variations, such as "comprises" or "comprising," will be understood to imply the inclusion of stated elements, but not the exclusion of any other elements.

Further, in this specification, the phrase "on a plane" means viewing a target portion from the top, and the phrase "on a cross-section" means viewing a cross-section formed by vertically cutting a target portion from the side.

Now, a plane structure of a display panel configuring a display device according to an exemplary embodiment will be described with reference to FIG. 1.

FIG. 1 is a top plan view of a display panel according to an exemplary embodiment.

A display panel included in a display device according to an exemplary embodiment may include an outer buffer area 201, a display area 100, a light-transmitting area 210, and a sealing and bonding region 251.

The display area 100 among areas of the display panel is an area where a plurality of pixels are arranged to display an image. One pixel includes a pixel circuit and a light emitting unit emitting light by receiving a current from the pixel circuit.

The light-transmitting area 210 has light transmittance that is relatively higher than that of the display area 100 and/or the outer buffer area 201, and the light-transmitting area 210 is a part in which the pixel is not disposed such that the image is not displayed. Since light is transmitted in the light-transmitting area 210, if at least one optical member 10 (see FIG. 2) is disposed under the light-transmitting area 210, the light is also incident to the optical member 10 or the light may be emitted from the optical member 10. The optical member 10 may be at least one of a camera, a flash, a sensor, etc. Hereinafter, the optical member 10 is described as the camera, but it is not limited thereto.

The light-transmitting area 210 as seen in FIG. 1 has a structure enclosed by the display area 100.

In an exemplary embodiment, the light-transmitting area 210 has a non-through-hole structure. That is, when having the through-hole structure, holes are formed in the substrates at both sides of the display panel; however, there is a difference that the hole is not formed in both substrates in the non-through-hole structure (see FIG. 2) of various exemplary embodiments. The size of the light-transmitting area 210 is larger than the size of one pixel, and the light-transmitting area 210 is different from a light-transmitting zone formed in the pixel to realize a transparent display. For example, an area where the pixel circuit is formed in the pixel may have a rectangular shape of 25 μm (transverse) by 50 μm (longitudinal); however, the light-transmitting area 210 may have a circular structure with a diameter of, for instance, 3 mm.

In some exemplary embodiments, a boundary dividing the display area 100 and the light-transmitting area 210 may be disposed therebetween, and a light blocking member blocking light may be formed in the boundary.

The outer buffer area 201 is an area completely enclosing the display area 100 and the light-transmitting area 210. As seen in FIG. 1, the light-transmitting area 210 is completely enclosed by the display area 100 and the outer buffer area 201 has a structure completely enclosing the display area 100.

Figure 19:
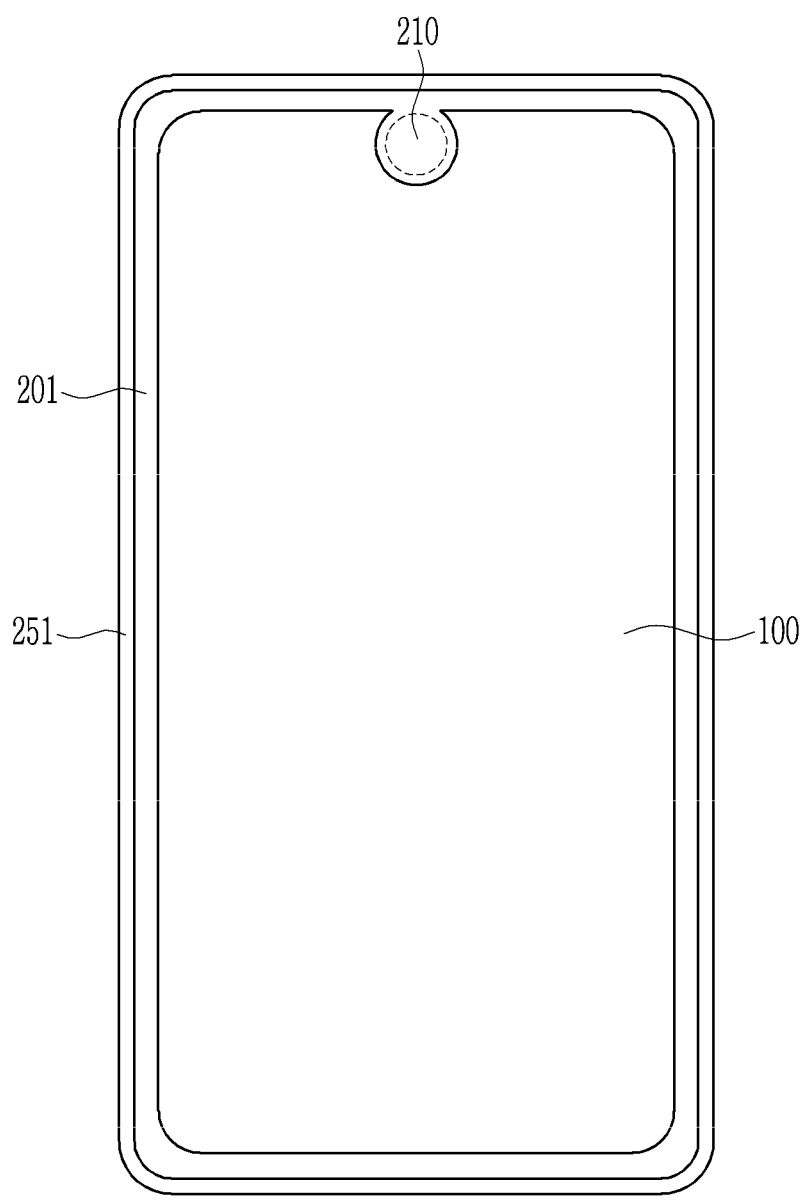
FIG. 19 is a top plan view of a display panel according to an exemplary embodiment.

In some exemplary embodiments, the outer buffer area 201 may extend between the display area 100 and the light-transmitting area 210, thereby having a structure separating the display area 100 and the light-transmitting area 210 from each other, such as shown in FIG. 19.

Further, the sealing and bonding region 251 has a structure completely enclosing the outer buffer area 201. The sealing and bonding region 251 may have an inorganic-inorganic sealing and bonding structure in which a plurality of inorganic layers are bonded. The sealing and bonding region 251 serves as an upper sealing structure with an upper glass substrate 150 (see FIG. 2), and prevents moisture from flowing into the organic light emitting unit from the outside. Also, the inorganic-inorganic sealing and bonding region 251 may be formed using a frit formed of the inorganic material bonded with the inorganic insulating layer (for example, a gate insulating layer or an interlayer insulating layer) disposed on the lower glass substrate 140.

An exemplary cross-sectional structure taken along sectional line II-II' of FIG. 1 will now be described.

Figure 2:
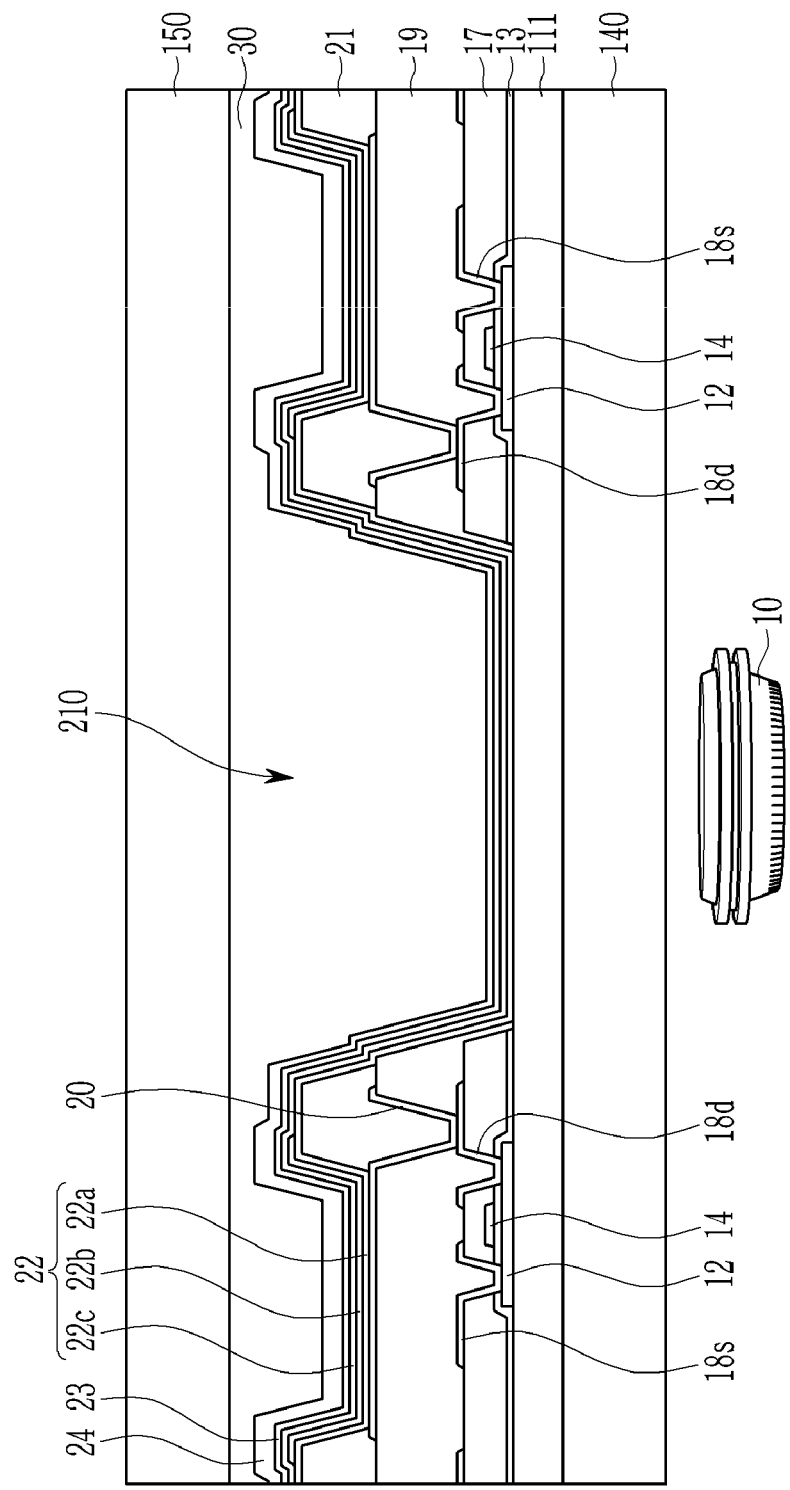
FIG. 2 is a cross-sectional view of a display panel of FIG. 1 taken along sectional line II-II' according to an exemplary embodiment.

FIG. 2 is a cross-sectional view of a display panel of FIG. 1 taken along sectional line II-II' according to an exemplary embodiment.

The light-transmitting area 210 in FIG. 2 is clearly shown to be a non-through-hole structure because the lower glass substrate 140 and the upper glass substrate 150 are not perforated.

In the exemplary embodiment of FIG. 2, the light-transmitting area 210 includes a lower glass substrate 140, a buffer layer 111, a hole injection layer 22a, and a common film electron transporting layer 22c configuring an organic light emitting element, a common film upper electrode 23, a common film organic passivation layer 24, an air layer 30, and the upper glass substrate 150. According to an exemplary embodiment, the common film upper electrode 23 may be omitted.

The light-transmitting area 210 has no opaque layer (a metal layer, a semiconductor layer, etc.) compared with the display area 100 described below, and loss of light occurring at the boundary of the layer is reduced as the number of layers is reduced, thereby improving the light transmittance.

The optical member 10 is disposed under the lower glass substrate 140 in (or adjacent to) the rear surface of the light-transmitting area 210, and the optical member 10 may be at least one of the camera, the flash, the sensor, etc.

The cross-sectional structure of the display area 100 according to an exemplary embodiment of FIG. 2 will now be described.

A plurality of pixels are formed in the display area 100, and one pixel includes the pixel circuit and the light emitting unit emitting light by receiving the current from the pixel circuit. The light emitting unit is divided based on a partition wall 21.

The buffer layer 111 is disposed on the lower glass substrate 140. According to an exemplary embodiment, the buffer layer 111 may be omitted, and in this case, the buffer layer 111 is also omitted in the light-transmitting area 210.

A semiconductor layer 12 is disposed on the buffer layer 111, and the semiconductor layer 12 includes a channel region, a source region, and a drain region of the thin film transistor.

A gate insulating layer 13 is disposed on the semiconductor layer 12, and the buffer layer 111 that is not covered by the semiconductor layer 12. The gate insulating layer 13 is an inorganic insulating layer including an inorganic material, such as a silicon nitride or a silicon oxide. Here, an example of the silicon nitride includes a $SiN_x$ and a SiON, and an example of the silicon oxide includes $SiO_2$.

A gate electrode 14 is disposed on the channel region of the semiconductor layer 12 on the gate insulating layer 13.

An interlayer insulating layer 17 covering the gate electrode 14 and the exposed gate insulating layer 13 is disposed thereon.

According to an exemplary embodiment, a second gate insulating layer covering the gate electrode 14 and a second gate electrode layer disposed thereon may be further included under the interlayer insulating layer 17.

The interlayer insulating layer 17 is also an inorganic insulating layer including the inorganic material, such as the silicon nitride or the silicon oxide. The gate insulating layer 13 and the interlayer insulating layer 17 have an opening exposing the source region and the drain region of the semiconductor layer 12.

A source electrode 18s and a drain electrode 18d are formed on the interlayer insulating layer 17, and are respectively connected to the source region and the drain region of the semiconductor layer 12 exposed through the opening.

A planarization layer 19 covering the source electrode 18s, the drain electrode 18d, and the interlayer insulating layer 17 exposed therefrom is formed thereon. The planarization layer 19 has an opening exposing the drain electrode 18d.

A pixel electrode 20 is disposed on the planarization layer 19 and is connected to the drain electrode 18d through the opening in the planarization layer 19.

The partition wall 21 (also referred to as a pixel definition layer) is disposed on the pixel electrode 20 and the planarization layer 19 exposed therefrom. The partition wall 21 has an opening exposing at least part of the pixel electrode 20, and an organic emission layer 22 is disposed within the opening. Here, the organic emission layer 22 may include a common film hole injection layer 22a, a separate film emission layer 22b, and a common film electron transporting layer 22c. Here, the common film means a film that is integrally connected to an adjacent pixel, and the separate film means a film that is only formed in the corresponding pixel. As a result, the separate film emission layer 22b is only formed in the opening of the partition wall 21 and the peripheral area thereof, but is separated from the separate film emission layer 22b of the adjacent pixel.

According to an exemplary embodiment, the organic emission layer 22 may include a hole transporting layer or an electron injection layer.

The common film upper electrode 23 is disposed on the organic emission layer 22, and the common film organic passivation layer 24 is disposed thereon.

The upper glass substrate 150 is disposed over the lower glass substrate 140, and an air layer 30 is formed between the upper glass substrate 150 and the common film organic passivation layer 24. The air layer 30 may be filled with nitrogen ($N_2$), and another filling material may be filled instead of the air layer.

A touch sensor structure (not shown) may be further formed on the upper glass substrate 150. Also, a film, such as a polarization film, may be adhered on the upper glass substrate 150. However, the touch sensor structure or the film is omitted in the light-transmitting area 210 (see FIG. 10), thereby having the structure improving the light transmittance.

As shown in FIG. 2, in the display panel according to an exemplary embodiment, the stacked structures of the light-transmitting area 210 and the display area 100 are different.

That is, since the thin film transistor must be formed in the display area 100, the plurality of layers are formed; however, in the light-transmitting area 210, only a transparent layer is configured and the light-transmitting area 210 is formed by removing an opaque layer (the semiconductor layer, the metal layer, etc.). As a result, in the light-transmitting area 210, light may pass between the lower glass substrate 140 and the upper glass substrate 150. Also, as the number of insulating layers included in the light-transmitting area 210 may be reduced, the light transmittance may be increased by blocking the leakage of light generated at the boundary of the layers.

If the transmittance of light is improved in the light-transmitting area 210 as described above, the light-transmitting characteristic is improved even though the light-transmitting area 210 has a non-through-hole structure, thereby improving the characteristic of the optical member 10 disposed at the rear surface. That is, if the optical member 10 is a camera, the image quality of the image taken by the camera is improved. According to some exemplary embodiments, the transmittance of the light-transmitting area 210 may be greater than 80% when the light is transmitted.

Various exemplary embodiments having a light-transmitting area 210 that is different from that of the exemplary embodiment described in association with FIG. 2 may be configured. That is, the light-transmitting area 210 may have no opaque layer (the metal layer, the semiconductor layer, etc.) compared to the display area 100 and the number of layers is reduced, and the light transmittance may be improved by reducing the loss of light occurring at the boundary of the layer.

Next, a structure of the display area 100 and the light-transmitting area 210 according to another exemplary embodiment is described with reference to FIG. 3.

Figure 3:
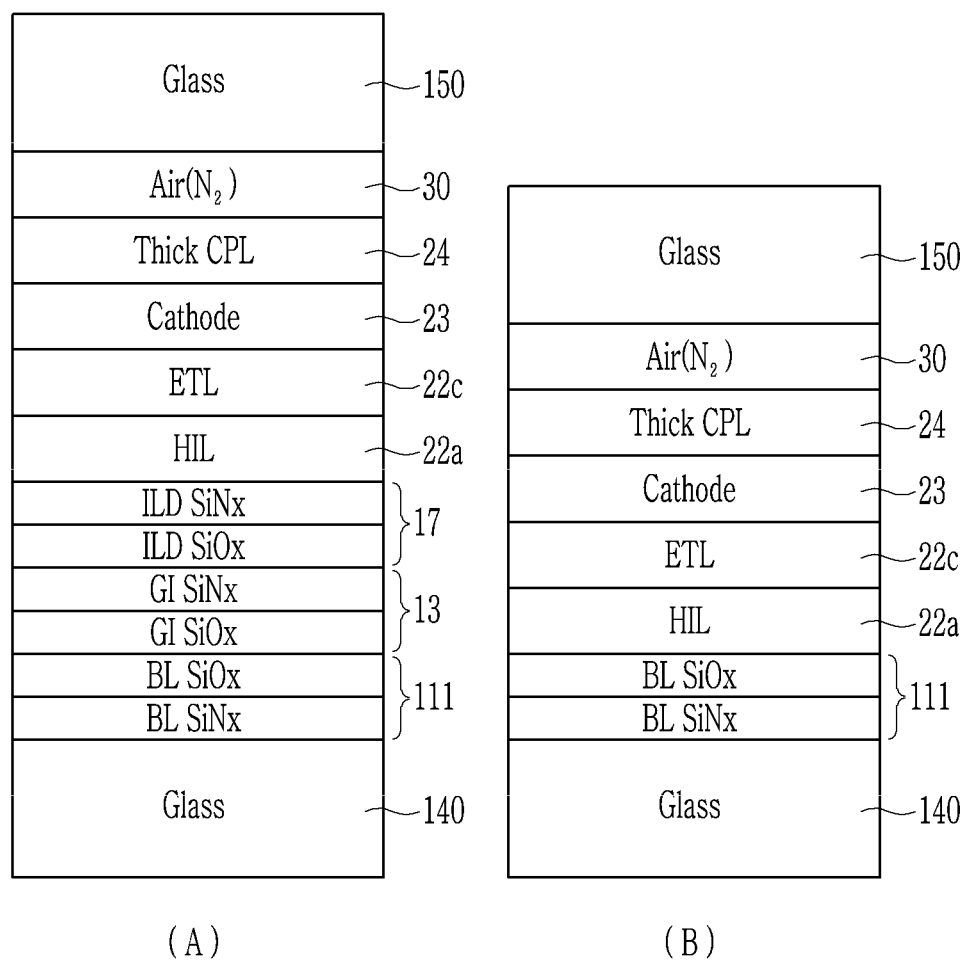
FIG. 3 is a cross-sectional view for comparing stacked structures of a display area and a light-transmitting area according to an exemplary embodiment.

FIG. 3 is a cross-sectional view for comparing stacked structures of a display area and a light-transmitting area according to an exemplary embodiment.

The exemplary embodiment described in association with FIG. 3 is an exemplary variation of the exemplary embodiment described in association with FIG. 2, and the stacking relationship between the display area 100 and the light-transmitting area 210 is compared while clarifying the stacking layers instead of showing the concrete structure like FIG. 2. FIG. 3 (A) shows the stacked structure of the display area 100, and FIG. 3 (B) shows the stacked structure of the light-transmitting area 210. Also, in the stacked structure of the display area 100 shown in FIG. 3 (A), the opaque layer is not shown.

The exemplary embodiment described in association with FIG. 3 is an exemplary embodiment in which the planarization layer 19 is omitted in the display area 100, unlike the exemplary embodiment described in association with FIG. 2.

First, the stacked structure of the display area 100 is described with reference to FIG. 3 (A).

The buffer layer (BL) 111 is disposed on the lower glass substrate (Glass) 140 of the display area 100. The buffer layer 111 in FIG. 3 has a double layered structure. The layer in contact with the lower glass substrate 140 is formed with a silicon nitride layer of a $SiN_x$, and a silicon oxide layer of a $SiO_x$ is formed thereon. According to an exemplary embodiment, the buffer layer 111 may have a single layer structure, and in this case, the buffer layer 111 may be formed of the silicon oxide layer of a $SiO_x$.

A gate insulating layer (GI) 13 is disposed on the buffer layer 111. In the exemplary embodiment described in association with FIG. 3, the gate insulating layer 13 is formed of the double layered structure of the first gate insulating layer and the second gate insulating layer. The first gate insulating layer contacts the buffer layer 111 and is formed of a silicon oxide layer of a $SiO_x$, which is the same material as the upper layer of the buffer layer 111. The second gate insulating layer is formed of the silicon nitride layer of a $SiN_x$.

The interlayer insulating layer (ILD) 17 is disposed on the gate insulating layer 13, which is the double layered structure, and the interlayer insulating layer 17 according to an exemplary embodiment described in association with FIG. 3 also has the double layered structure. The first interlayer insulating layer is in contact with the gate insulating layer 13 and is formed of the silicon oxide layer of a $SiO_x$, and the second interlayer insulating layer disposed thereon is formed of the silicon nitride layer of a $SiN_x$.

In the exemplary embodiment described in association with FIG. 3, a planarization layer 19 on the interlayer insulating layer 17 is omitted, and the organic emission layer 22 is disposed directly on the interlayer insulating layer 17. FIG. 3 shows the common film hole injection layer (HIL) 22a and the common film electron transporting layer (ETL) 22c formed to be connected for the entire pixel among the organic emission layer 22. The separate film emission layer 22b included in the organic emission layer 22 is disposed only in the some regions and is not included in FIG. 3 (A). For similar reasons, the partition wall 21 is also omitted.

A common film upper electrode (Cathode) 23 is disposed on the organic emission layer 22, and a common film organic passivation layer (Thick CPL) 24 is disposed thereon. The common film upper electrode 23 may include a transparent electrode material.

The air layer ($AirN_2$) 30 is disposed on the common film organic passivation layer 24 and the air layer 30 is filled with nitrogen ($N_2$).

The upper glass substrate (Glass) 150 is disposed on the air layer 30.

Unlike the display area 100 having the stacked structure as described above, the light-transmitting area 210 has the stacked structure shown in FIG. 3 (B).

The light-transmitting area 210 of the exemplary embodiment described in association with FIG. 3 does not include the gate insulating layer 13 and the interlayer insulating layer 17, unlike the display area 100.

That is, in the light-transmitting area 210, the buffer layer 111 of the double layer is disposed on the lower glass substrate 140 and some layers among the organic emission layer 22 are disposed on the buffer layer 111 in FIG. 3 (B), and only the common film hole injection layer 22a and the common film electron transporting layer 22c entirely disposed among the organic emission layer 22 are formed in the light-transmitting area 210. The common film upper electrode 23 is disposed on the electron transporting layer 22c, and the common film organic passivation layer 24 is disposed thereon. The common film organic passivation layer 24 is thickly formed. The common film organic passivation layer 24 is formed thickly because the common film upper electrode 23 is formed in the light-transmitting area 210. That is, when the common film upper electrode 23 is formed in the light-transmitting area 210, it is necessary to form the organic passivation layer 24 thickly to improve the light transmittance. Here, to be thicker means that the common film organic passivation layer 24 is formed with a thickness of about 600 Å to 1000 Å, which is the thickness generally applied in production.

The air layer 30 is formed on the common film organic passivation layer 24, and the air layer 30 is filled with nitrogen ($N_2$). The upper glass substrate 150 is disposed on the air layer 30.

According to the exemplary embodiment, the air layer 30 may be filled with another filling material in place of nitrogen ($N_2$).

The exemplary stacked structures described in association with FIG. 2 and FIG. 3 may be varied. That is, the stacked structure of the light-transmitting area 210 may be variously formed by combining the remaining layers except for the opaque film among the layers included in the display area 100. Which direction is a more appropriate direction among these various combinations is described with reference to FIGS. 4 and 5.

FIG. 4 is a table summarizing a transmittance characteristic according to a stacked structure according to an exemplary embodiment. FIG. 5 is a table showing a transmittance improvement of each stacked structure of FIG. 4 according to an exemplary embodiment.

First, in FIG. 4, the stacked structure of the display area 100 (indicated by an active area) and the light-transmitting area 210 (indicated by a transparent hole) is largely divided into a TFT insulating layer, a TFT organic layer, an OLED organic layer, a cathode, a CPL, and a filler.

First, the TFT insulating layer refers to the insulating layer corresponding to the buffer layer 111, the gate insulating layer 13, and the interlayer insulating layer 17 in the exemplary embodiments described in association with FIG. 2 and FIG. 3, and represents the layer configured of the inorganic insulating layer.

The TFT organic layer represents the planarization layer 19 in the exemplary embodiment described in association with FIG. 2. Also, the TFT organic layer may include other organic layers formed on the interlayer insulating layer 17.

The OLED organic layer refers to the organic layer included in the organic emission layer 22 described in association with FIG. 2 and FIG. 3, and may include the various organic layers. The organic emission layer 22 may include layers, such as a hole injection layer, a hole transporting layer, an organic emission layer, an electron transporting layer, an electron injection layer, etc., and in FIG. 4, only the hole injection layer HIL, the organic emission layer RGB, the electron transporting layer ETL, and the electron injection layer EIL are included. The organic emission layer RGB may use the different organic emission layers for each color, and they are expressed in one group.

In the exemplary embodiments described in association with FIG. 2 and FIG. 3, the cathode refers to the common film upper electrode 23, and CPL refers to the common film organic passivation layer 24 as a capping layer.

As described in association with FIG. 2 and FIG. 3, the filler refers to the air layer 30, which may be a separate filling material, rather than the air or nitrogen, according to the exemplary implementation. As the filling material, a silicon (Si) series organic layer can be used.

Each of these layers may be formed in various combinations in the display area 100. The light-transmitting area 210 is formed so that the transmittance is excellent by deleting a part of the layers included in the display area 100, and numerous exemplary variations are described with reference to the table of FIG. 4.

First, in the display area 100, a nitride layer (e.g., a silicon nitride ($SiN_x$) layer) including N and an oxide layer (e.g., a silicon oxide ($SiO_x$) layer) including O are alternately formed in the TFT insulating layer. Even if the nitride layer and the oxide layer are alternately formed, problems may not occur in the display area 100; however, in the light-transmitting area 210, light is reflected or refracted at the boundary between the oxide layer and the nitride layer, resulting in the loss of light and lower transmittance. This may be attributed to the refractive index of the oxide layer and that of the nitride layer being large. Therefore, to improve the transmittance of light in the light-transmitting area 210, it is desirable to minimize the boundary between the oxide layer and the nitride layer. For example, instead of alternately forming the oxide layer and the nitride layer, the oxide layer may be formed twice, and then the nitride layer may be formed twice, thereby reducing the number of boundaries between the oxide layer and the nitride layer. In addition, the TFT insulating layer may be formed only by the nitride layer or the oxide layer.

On the other hand, since the TFT organic layer disposed on the TFT insulating layer has the characteristic of flattening in the display area 100, it is a necessary layer; however, in the light-transmitting area 210, the organic layer be omitted due to the light loss occurring at the boundary between the inorganic layer and the organic layer in the light-transmitting area 210. However, it is preferable that the organic layer is formed in the light-transmitting area 210 according to some exemplary embodiments, in which case an infrared (IR) camera is used as the optical member 10.

In addition, the OLED organic layer disposed on the TFT organic layer is a layer necessary for emitting light of the display area 100, but in the light-transmitting area 210, it is preferable to remove the other layer except the layer having excellent transparency. For example, it is desirable to remove the organic emission layer RGB, and other layers may not be omitted or may be omitted according to various exemplary embodiments.

The cathode may be formed of the transparent conductive material, but it is preferable to remove the cathode when the transmittance of the light-transmitting area 210 is set to 80% or more because the light loss is large due to the cathode. However, as shown in the exemplary embodiments described in association with FIG. 2 and FIG. 3, the common film upper electrode 23 may be included in the light-transmitting area 210. In this case, it is suitable to reduce the light loss by forming the common film organic passivation layer 24 to be thickly disposed thereon. Here, the thickly disposed layer means that the common film organic passivation layer 24 is formed to the thickness of about 600 Å to 1000 Å, which is the thickness generally applied at the time of mass production.

When the common film upper electrode 23 is not formed in the light-transmitting area 210, the common film organic passivation layer 24, which is the capping layer CPL, is preferably thinly formed. The thin thickness may correspond to half of the thickness of the generally formed common film organic passivation layer 24. That is, when mass-produced, the common film organic passivation layer 24 is formed to a thickness of about 600 Å to 1000 Å, so that the thinner common film organic passivation layer 24 has a thickness of 300 Å to 500 Å.

On the other hand, according to some exemplary embodiments, if the common film upper electrode 23 is not formed, the transmittance of light may be improved even when the common film organic passivation layer 24 is formed to be very thick in the light-transmitting area 210. Generally, according to the change of thickness, transmittance also changes between highest and lowest. Thus, the high transmittance may occur in that thickness of the common film organic passivation layer 24. However, when considering the trend of thinning the display device, it is preferable to form the common film organic passivation layer 24 thinly at the thickness of 300 Å to 500 Å.

On the other hand, when the common film upper electrode 23 is disposed in the light-transmitting area 210, the common film organic passivation layer 24 is formed thinly (the thickness of 300 Å to 500 Å) or thickly (the thickness of 600 Å to 1000 Å), as there is little difference in transmittance. This may be attributed not only to no change in transmittance due to the thickness change of the common film organic passivation layer 24, but also to the light loss due to the common film upper electrode 23 being large.

In the light-transmitting area 210, a filler material may be separately used to further increase the transmittance of the light since the filler may suffice as an air layer in the display area 100, but light loss may also occur in the boundary of the air layer. As the filling material, a silicon (Si) series organic layer may be used.

When the stacking relationship of the light-transmitting area 210 is changed as shown in FIG. 4, the transmittance is improved as shown in the table of FIG. 5.

Referring to FIG. 5, when the boundary between the nitride layer and the oxide layer is omitted in the TFT insulating layer of the light-transmitting layer 210, the transmittance is improved by about 6%. When the TFT organic layer is removed from the light-transmitting area 210, the transmittance is improved by about 6-10%. In addition, if the upper electrode 23 is omitted from the light-transmitting area 210, the light transmittance is improved by less than about 10%. Moreover, if the common film organic passivation layer 24 is thinned with the omission of the common film upper electrode 23, the light transmittance is additionally improved by less than about 10%. Also, when the filler (e.g., air layer 30) is used, the transmittance is improved by less than about 10%.

Therefore, if the target transmittance of the light-transmitting area 210 is set, the stacked structure of the light-transmitting area 210 may be combined based on the effects described in association with FIG. 5. On the other hand, for higher transmittance of 80% or more, the common film upper electrode 23 may be omitted, and accordingly, the common film organic passivation layer 24 may be formed thinly to the thickness of 300 Å to 500 Å.

In addition, when the difference in refractive index between adjacent layers is set to 0.2 or less, the transmittance of the light-transmitting area 210 may be highly maintained. According to various exemplary embodiments, the difference in refractive index between the adjacent layers may be set to 0.3 to 0.5.

The transmittance of the light-transmitting area 210 may be maximized by applying all of the improvement factors of the transmittance as described in association with FIG. 4 and FIG. 5, but the light-transmitting area 210 may be formed by applying only some of the improvement factors.

Hereinafter, a representative example of the various exemplary variations of the light-transmitting area 210 according some exemplary embodiments described in association with FIG. 4 and FIG. 5 are described with reference to FIGS. 6 to 9. The light-transmitting area 210 in FIGS. 6 to 9 are exemplary embodiments having the high light transmittance of 80% or more by removing the common film upper electrode 23, unlike the light-transmitting area 210 described in association with FIG. 2 and FIG. 3.

FIGS. 6, 7, 8, and 9 are cross-sectional views showing various stacked structures of a light-transmitting area according to some exemplary embodiments.

Figure 6:
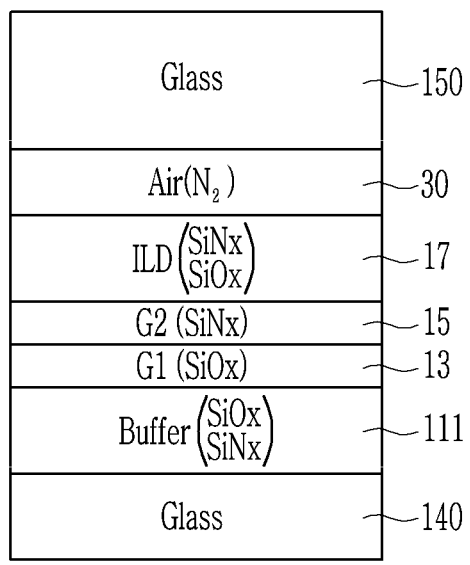
FIGS. 6, 7, 8, and 9 are cross-sectional views showing various stacked structures of a light-transmitting area according to some exemplary embodiments.

First, the stacked structure of the light-transmitting area 210 of FIG. 6 is described.

In the light-transmitting area 210 according to the exemplary embodiment described in association with FIG. 6, the buffer layer 111 of the double layer in which the silicon nitride ($SiN_x$) layer and the silicon oxide ($SiO_x$) layer are sequentially formed is disposed on the lower glass substrate 140.

The double layer gate insulating layer (first and second gate insulating layers 13 and 15) is disposed on the buffer layer 111. The first gate insulating layer 13 is formed of the silicon oxide ($SiO_x$) layer, and the second gate insulating layer 15 is formed of the silicon nitride ($SiN_x$) layer.

The interlayer insulating layer 17 is disposed on the first and second gate insulating layers 13 and 15 of the double layer, and the interlayer insulating layer 17 also has the double layer structure in which the silicon oxide ($SiO_x$) layer and the silicon nitride ($SiN_x$) layer are sequentially formed on the first and second gate insulating layers 13 and 15.

The TFT organic layer and the OLED organic layer are omitted on the interlayer insulating layer 17. That is, the organic layer is not included. The air layer 30 is disposed above the interlayer insulating layer 17 and the air layer 30 is filled with nitrogen ($N_2$).

The upper glass substrate 150 is disposed on the air layer 30.

In the stacked structure of the light-transmitting area 210 according to the exemplary embodiments described in association with FIG. 6, referring to FIG. 4, the TFT insulating layers 111, 13, 15, and 17 are all included, the organic layer (the TFT organic layer and the OLED organic layer) are both omitted, and the common film upper electrode (the cathode) 23 and the organic passivation layer 24 are also omitted.

Also, in the exemplary embodiments described in association with FIG. 6, the layer disposed upward in the double layer of the buffer layer 111 among the TFT insulating layer and the first gate insulating layer 13 are equally formed of the silicon oxide ($SiO_x$) layer, thereby removing one boundary surface having the large refractive index by being formed of the same material. Accordingly, the light transmittance of the light-transmitting area 210 is further improved.

In the exemplary embodiments described in association with FIG. 6, the organic passivation layer 24 may be further formed thinly to the thickness of 300 Å to 500 Å below the air layer 30. However, the structure of FIG. 6 in which the organic passivation layer 24 is not formed may have higher light transmittance.

Hereinafter, an exemplary embodiment to be described in association with FIG. 7 will be described. The light-transmitting area 210 of FIG. 7 is one of the exemplary embodiments in which the fewest layers are included.

Figure 7:
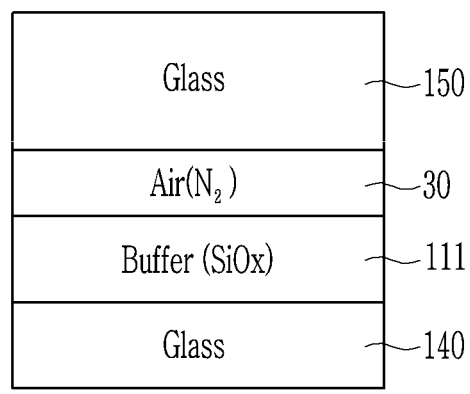

In the light-transmitting area 210 according to the exemplary embodiments described in association with FIG. 7, the buffer layer 111 of the single layer formed of the silicon oxide ($SiO_x$) layer is disposed on the lower glass substrate 140. The gate insulating layer, the interlayer passivation layer, the TFT organic layer, the OLED organic layer, the common film upper electrode 23, and the common film organic passivation layer 24 disposed on the buffer layer 111 are all omitted. Thereafter, the air layer 30 is disposed and the upper glass substrate 150 is disposed on the air layer 30.

In the exemplary embodiments described in association with FIG. 7, the transmittance may be high due to the small number of boundary surfaces. In FIG. 7, the air layer 30 may be filled with the filling material to have higher transmittance, and the refractive index of the filling material may have an intermediate refractive index between the silicon oxide layer and the glass substrate. As the filling material, the silicon (Si)-based organic materials may be used.

Hereinafter, the stacked structure of the light-transmitting area 210 of FIG. 8 will be described.

Figure 8:
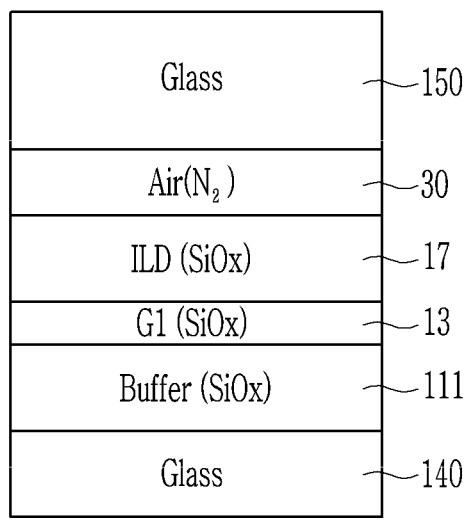

The exemplary embodiments described in association with FIG. 8, unlike the exemplary embodiments described in association with FIG. 6, are exemplary embodiments in which the TFT insulating layer is all formed of the silicon oxide ($SiO_x$) layer.

That is, in the light-transmitting area 210 according to the exemplary embodiment described in association with FIG. 8, the buffer layer 111 of the single layer formed of the silicon oxide ($SiO_x$) layer is disposed on the lower glass substrate 140.

The gate insulating layer 13 of the single layer is disposed on the buffer layer 111 and the gate insulating layer 13 is formed of the silicon oxide ($SiO_x$) layer.

The interlayer insulating layer 17 is disposed on the gate insulating layer 13 of the single layer, and the interlayer insulating layer 17 is also formed of the single layer of the silicon oxide ($SiO_x$) layer.

The TFT organic layer and the OLED organic layers are omitted on the interlayer insulating layer 17. The air layer 30 is disposed on the interlayer insulating layer 17, and the air layer 30 is filled with nitrogen ($N_2$).

The upper glass substrate 150 is disposed on the air layer 30.

Unlike the exemplary embodiment described in association with FIG. 8, the TFT insulating layer may be formed of the silicon nitride layer. However, considering the refractive index characteristic with the glass substrate, it may be more appropriate to form the TFT insulating layer with only the silicon oxide layer like in the exemplary embodiments described in association with FIG. 8 rather than the silicon nitride layer.

Hereinafter, the stacked structure of the light-transmitting area 210 according to the exemplary embodiments described in association with FIG. 9 will be described.

Figure 9:
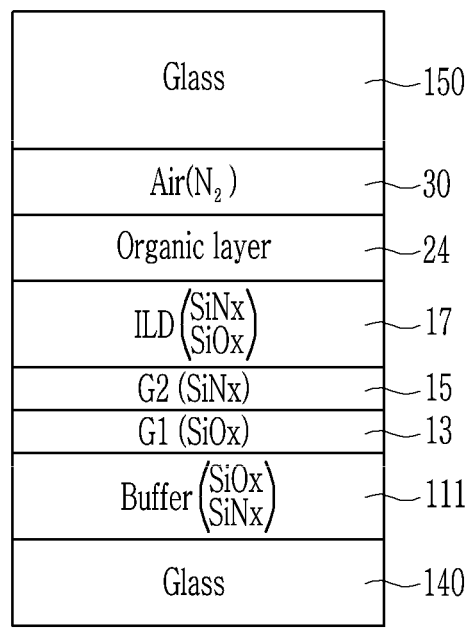

The exemplary embodiments described in association with FIG. 9 are exemplary embodiments in which an organic layer, such as the common film organic passivation layer 24, is further included in the structure of FIG. 6.

That is, in the light-transmitting area 210 according to the exemplary embodiments described in association with FIG. 9, the buffer layer 111 of the double layer in which the silicon nitride ($SiN_x$) layer and the silicon oxide ($SiO_x$) layer are sequentially formed is disposed on the lower glass substrate 140.

The first and second gate insulating layers 13 and 15 of the double layer are disposed on the buffer layer 111. The first gate insulating layer 13 is formed of the silicon oxide ($SiO_x$) layer, and the second gate insulating layer 15 is formed of the silicon nitride ($SiN_x$) layer.

The interlayer insulating layer 17 is disposed on the first and second gate insulating layers 13 and 15 of the double layer, and the interlayer insulating layer 17 also has the double layer structure in which the silicon oxide ($SiO_x$) layer and the silicon nitride ($SiN_x$) layer are sequentially formed.

The organic layer, e.g., the common film organic passivation layer 24, is disposed on the interlayer insulating layer 17. The organic layer in the exemplary embodiments described in association with FIG. 9 is the common film organic passivation layer 24 disposed on the common film upper electrode 23. However, according to some exemplary embodiments, one of the TFT organic layer and the OLED organic layer may be used. The organic layer, such as the common film organic passivation layer 24, may be formed to the thickness of 300 Å to 500 Å without the common film upper electrode 23.

The air layer 30 is disposed on the organic layer, e.g., the common film organic passivation layer 24, and the air layer 30 is filled with nitrogen ($N_2$). The upper glass substrate 150 is disposed on the air layer 30.

Unlike the exemplary embodiments described in association with FIG. 6, the exemplary embodiments described in association with FIG. 9 shows that the organic layer, e.g., the organic passivation layer 24, is added, and the organic layer may also be added in the exemplary embodiments described in association with FIG. 7 and FIG. 8.

The organic material used as the common film organic passivation layer 24 may include the organic material of which the transmittance for light of about a 550 nm wavelength is about 70% or more and a yellow index is about 95 or less in the thickness of about 0.025 mm. For example, the material may be the organic material of which the transmittance for light of about 550 nm wavelength is about 80% or more and a yellow index is about 20 or less in the thickness of about 0.025 mm.

According to some exemplary embodiments, the common film organic passivation layer 24 may use a colored polyimide (PI), a transparent PI, or an acryl-based resin. Here, the colored PI may include a PI having a yellowish characteristic. Also, according to some exemplary embodiments, the common film organic passivation layer 24 may use a siloxane organic material and/or a silazane organic material.

In FIG. 9, the common film organic passivation layer 24 is included, and the structure including the common film organic passivation layer 24 is further suitable for the optical member 10 sensing infrared rays (IR). In contrast, when using the camera sensing visible rays as the optical member 10, a better quality picture may be obtained by omitting the common film organic passivation layer 24.

In the above, the stacked relation below the upper glass substrate 150 was mainly described.

Hereinafter, various structures of the light-transmitting area 210 will be described based on the stacked structure formed on the upper glass substrate 150, and first, at least one exemplary embodiment in which a polarizer 230 attached to the upper glass substrate 150 is omitted in the light-transmitting area 210, is described with reference to FIGS. 10 to 12.

Figure 10:
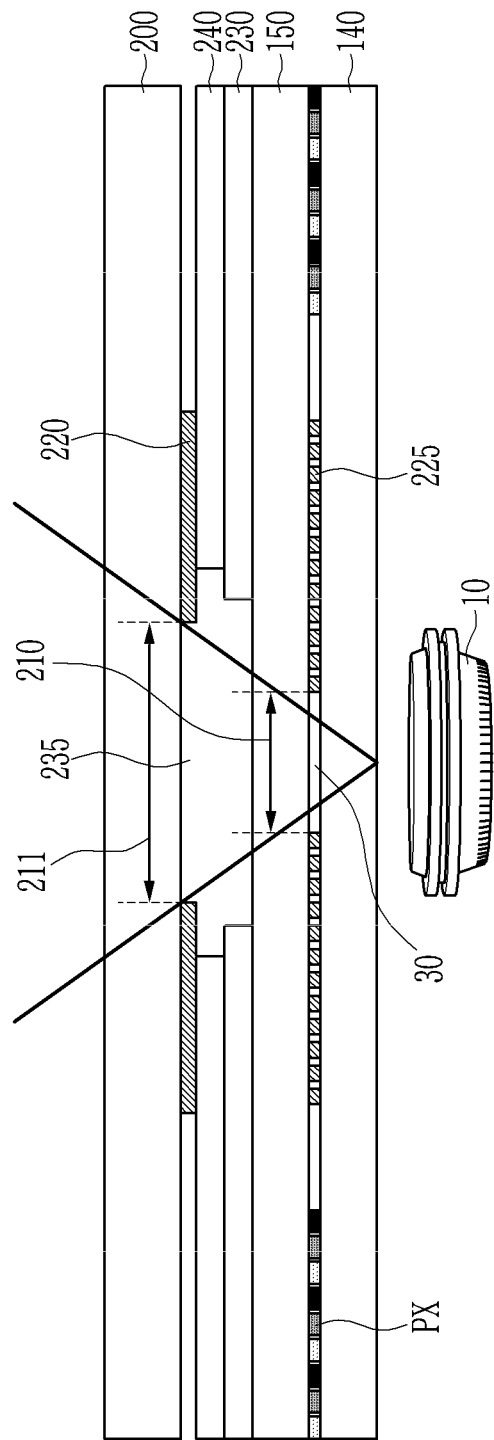
FIGS. 10, 11, and 12 are cross-sectional views of various display panels according to some exemplary embodiments.
Figure 11:
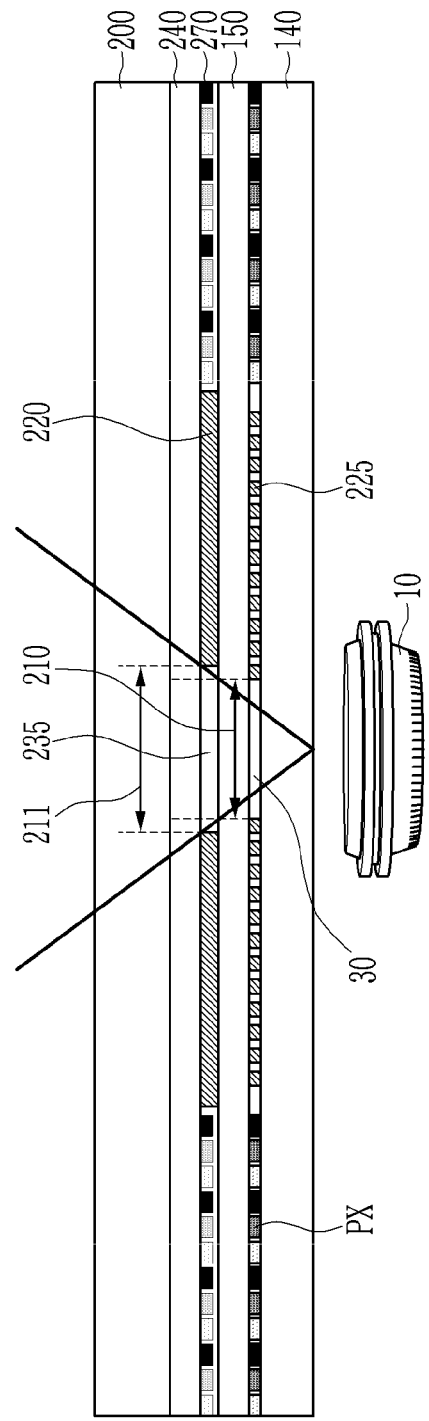
Figure 12:
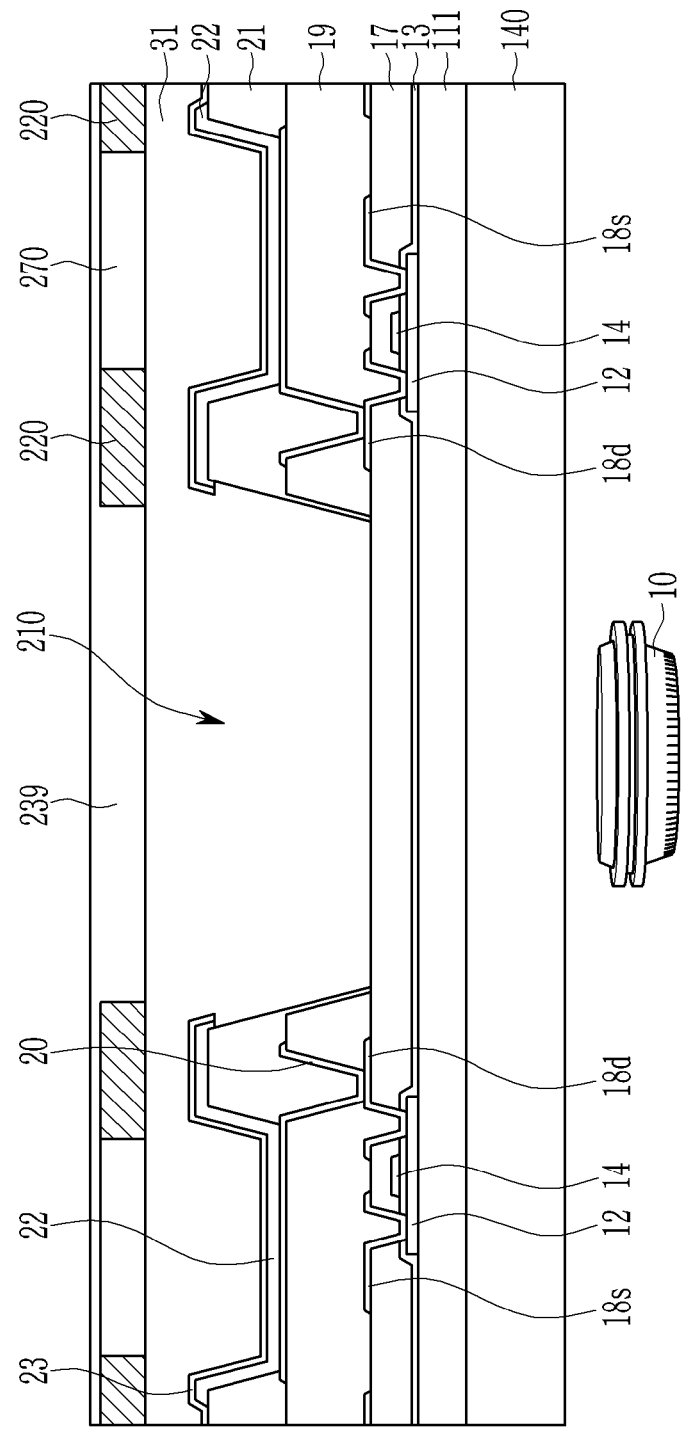

FIGS. 10, 11, and 12 are cross-sectional views of various display panels according to some exemplary embodiments.

First, a display panel as seen in FIG. 10 is described.

FIG. 10 shows a simplified representation of a lower glass substrate 140 and an upper glass substrate 150 in a display panel. That is, FIG. 10 simplifies the pixel PX including the thin film transistor and the organic light emitting element in the display area 100. Also, FIG. 10 simplifies that the air layer 30 is disposed between the upper glass substrate 150 and the lower glass substrate 140.

In the exemplary embodiment described in association with FIG. 10, a first light blocking member 225 (also referred to as a lower light blocking member) dividing the light-transmitting area 210 and the display area 100 is disposed at a region where the first light blocking member 225 is disposed corresponds to a boundary dividing the display area 100 and the light-transmitting area 210. The first light blocking member 225 is disposed around the light-transmitting area 210, and first light blocking member 225 has the opening corresponding to the light-transmitting area 210, and the opening corresponds to the light-transmitting area 210. The first light blocking member 225 also blocks the light emitted from the pixel PX from being transmitted to the light-transmitting area 210.

A polarizer 230 is disposed on the display area 100 above the upper glass substrate 150. The polarizer 230 is not disposed on the light-transmitting area 210 and has the opening corresponding to the light-transmitting area 210. As the polarizer 230 is not disposed in the light-transmitting area 210, the light transmittance of the light-transmitting area 210 is increased.

An adhesive layer (OCA) 240 is disposed on the polarizer 230. The adhesive layer 240 allows the polarizer 230 and a window 200 to be attached. The adhesive layer 240 may not be formed in the portion corresponding to the light-transmitting area 210.

A second light blocking member 220 (also referred to as an upper light blocking member) is disposed on the inner surface of the window 200, and the second light blocking member 220 is in direct contact with the adhesive layer 240. The second light blocking member 220 also has the opening corresponding to the light-transmitting area 210, thereby not being formed in the light-transmitting area 210. Also, the second light blocking member 220 has the opening corresponding to a second light-transmitting area 211 that is wider than the light-transmitting area 210. The second light blocking member 220 has the structure enclosing the second light-transmitting area 211. The second light blocking member 220 may or may not be disposed in the display area 100. When the second light blocking member 220 is disposed in the display area 100, the second light blocking member 220 has an opening, and the image is displayed while the light emitted from the pixel PX is transmitted through the opening.

The first light blocking member 225 defines the light-transmitting area 210, and the second light blocking member 220 defines the second light-transmitting area 211 that is larger than the light-transmitting area 210.

This allows the light provided from the outside to be collected and transmitted to the optical member 10, which is the structure to provide a wide field of view of the optical member 10. Also, when the optical member 10 is the camera, it is also a structure considering the field of view of the camera.

An air layer 235 is disposed at the space defined by the opening of the polarizer 230, the opening of the adhesive layer 240, and the opening of the second light blocking member 220 between the upper glass substrate 150 and the window 200. However, according to an exemplary embodiment, the filling material may be disposed. The filling material may be a silicon (Si)-based organic material.

The polarizer 230 and the adhesive layer 240 are not disposed in the light-transmitting area 210 and the second light-transmitting area 211. According to an exemplary embodiment, the adhesive layer 240 may be formed in the light-transmitting area 210 and the second light-transmitting area 211. In the exemplary embodiment described in association with FIG. 10, the opening of the polarizer 230 and the adhesive layer 240 may be formed to be wider than the opening of the first light blocking member 225 and the opening of the second light blocking member 220.

As above-described, as the polarizer 230 is not formed corresponding to the light-transmitting area 210, the light transmittance of the light-transmitting area 210 is improved.

Next, the structure of FIG. 11 is described.

The exemplary embodiments described in association with FIG. 11 does not include the polarizer 230, differently from the exemplary embodiments described in association with FIG. 10. Also, a color filter 270 is included in the exemplary embodiments described in association with FIG. 11. Also, in the exemplary embodiments described in association with FIG. 11, the second light blocking member 220 is disposed at the upper surface of the upper glass substrate 150.

The stacked structure located above the upper glass substrate 150 of the exemplary embodiment described in association with FIG. 11 is described in detail as follows.

The color filter 270 is disposed in the upper surface of the upper glass substrate 150 in the display area 100. The second light blocking member 220 is disposed at the boundary between the display area 100 and the light-transmitting area 210, and the opening of the second light blocking member 220 corresponds to the second light-transmitting area 211.

The adhesive layer 240 is disposed on the color filter 270 and the second light blocking member 220. The adhesive layer 240 is also disposed at the portion corresponding to the light-transmitting area 210. The window 200 is attached by the adhesive layer 240.

Between the upper glass substrate 150 and the adhesive layer 240, the air layer 235 is formed in the opening of the second light blocking member 220. According to an exemplary embodiment, the air layer 235 may be filled with the filling material. The filling material may be the silicon (Si)-based organic material.

In the exemplary embodiments described in association with FIG. 11, the second light blocking member 220 is not disposed at the lower surface of the window 200, but is disposed at the upper surface of the upper glass substrate 150 so the efficiency in preventing the light transmitting from the light-transmitting area 210 from being leaked is improved.

In the exemplary embodiments described in association with FIG. 11, the width of the opening of the second light blocking member 220 may be formed at about 3.25 mm, and in contrast, in the exemplary embodiments described in association with FIG. 10, the width of the opening of the second light blocking member 220 may be formed at about 4.3 mm. This may be attributed to the required opening width being different as the height from the optical member 10 increases. Therefore, the exemplary embodiments described in association with FIG. 11 may form the second light blocking member 220 with a smaller opening, so there is a merit that can make the region (the second light-transmitting area 220) that is not displayed to be smaller.

Also, in the exemplary embodiments described in association with FIG. 11, since the polarizer 230 is not used, the thickness of the display panel decreases.

Next, the exemplary embodiments described in association with FIG. 12 will be described.

FIG. 12 shows exemplary embodiments in which the upper glass substrate 150 is omitted, unlike in FIG. 10 and FIG. 11. Instead of removing the upper glass substrate 150, the organic light emitting element is formed through an encapsulation layer 31 so as to prevent moisture from entering.

The structure of FIG. 12 is the same as the structure to the pixel electrode 20 as compared with the structure in FIG. 2. That is, in the display area 100, the lower glass substrate 140, the buffer layer 111, the semiconductor layer 12, the gate insulating layer 13, the gate electrode 14, the interlayer insulating layer 17, the source electrode 18s and the drain electrode 18d, and the planarization layer 19 are sequentially formed. The planarization layer 19 has the opening exposing the drain electrode 18d, and the pixel electrode 20 is connected to the drain electrode 18d through the opening.

A partition wall 21 (also referred to as a pixel definition layer) is disposed on the pixel electrode 20 and the planarization layer 19 exposed by the pixel electrode 20. The partition wall 21 has the opening exposing at least part of the pixel electrode 20, and the organic emission layer 22 is formed in the opening. In an exemplary embodiment, the organic emission layer 22 has the structure extending beyond the opening of the partition wall 21 and extending toward the light-transmitting area 210. However, the organic emission layer 22 has the structure that does not extend into the opening of the adjacent partition wall 21. The common film upper electrode 23 is disposed on the organic emission layer 22.

On the other hand, depending on FIG. 12, the light-transmitting area 210 has the stacked structure below, unlike the display area 100.

The light-transmitting area 210 includes the lower glass substrate 140, the buffer layer 111, the gate insulating layer 13, and the interlayer insulating layer 17.

The display area 100 and the light-transmitting area 210 as described above are covered by the encapsulation layer 31. The encapsulation layer 31 is the layer that prevents moisture from permeating into the organic emission layer 22, and may include the structure that blocks moisture penetration by including the plurality of inorganic and organic layers depending on the exemplary embodiment. The encapsulation layer 31 corresponds to the upper glass substrate 150 in FIG. 2 and performs the function of the upper glass substrate 150 and the sealing and bonding region 251, that is, to prevent moisture penetration.

On the encapsulation layer 31, the second light blocking member 220 and the color filter 270 are formed on the display area 100. The second light blocking member 220 has the opening at the portion where the color filter 270 is disposed and the portion corresponding to the light-transmitting area 210, respectively. The color filter 270 is formed at the position corresponding to the opening of the partition wall 21.

The second light blocking member 220, the color filter 270, and the exposed encapsulation layer 31 are covered by an overcoat layer 239. The overcoat layer 239 is formed into the light-transmitting area 210 on the encapsulation layer 31.

Although not shown in FIG. 12, the window 200 may be formed on the overcoat layer 239, or the polarizer 230 may also be included as shown in FIG. 10 and FIG. 11.

The encapsulation layer 31 used in the exemplary embodiment described in association with FIG. 12 is shown like the single layer in FIG. 12; however, it actually has a structure including a plurality of layers. When the refractive indexes of each layer are different, matching the refractive index in the encapsulation layer 31 itself also helps to improve the light transmittance of the light-transmitting area 210 because of the loss of light generated at the boundary of the layer.

The light-transmitting characteristic and the matching method of the refractive index according to the stacked structure of the encapsulation layer 31 will now be described with reference to FIGS. 13 to 15.

Figure 13:
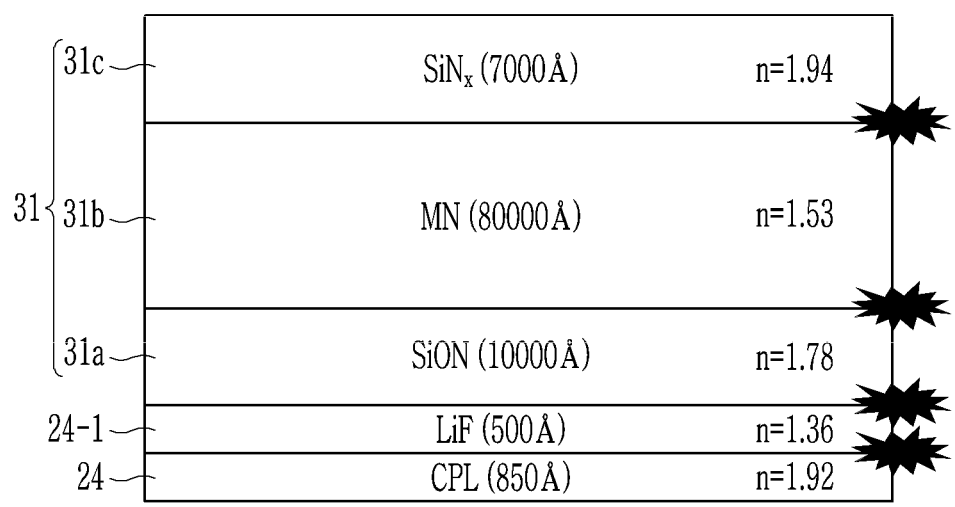
FIGS. 13, 14, and 15 are cross-sectional views showing various stacked structure of an encapsulation layer according to some exemplary embodiments.
Figure 14:
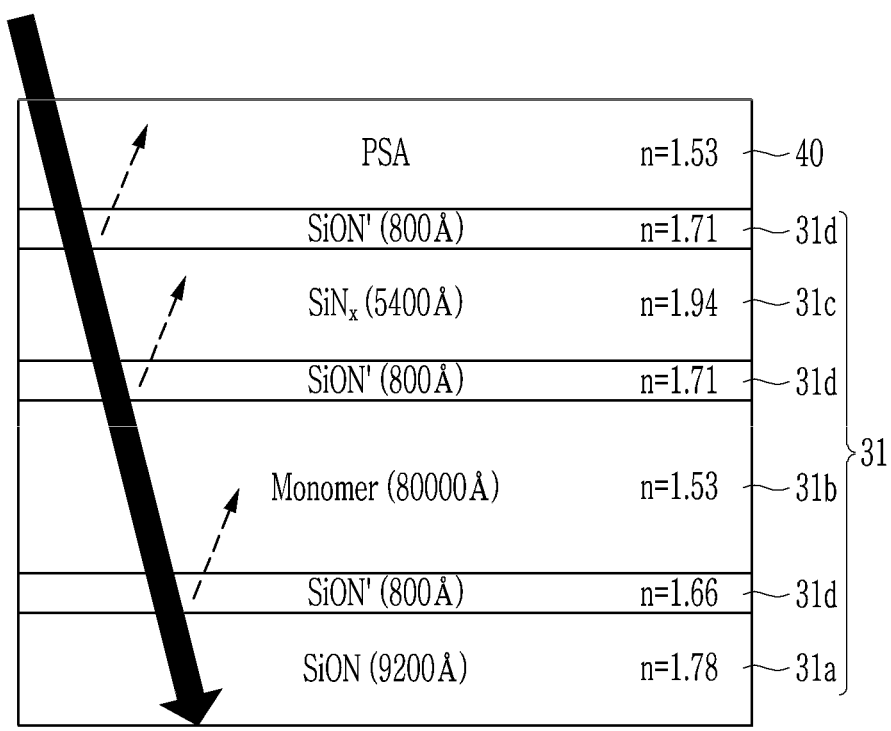
Figure 15:
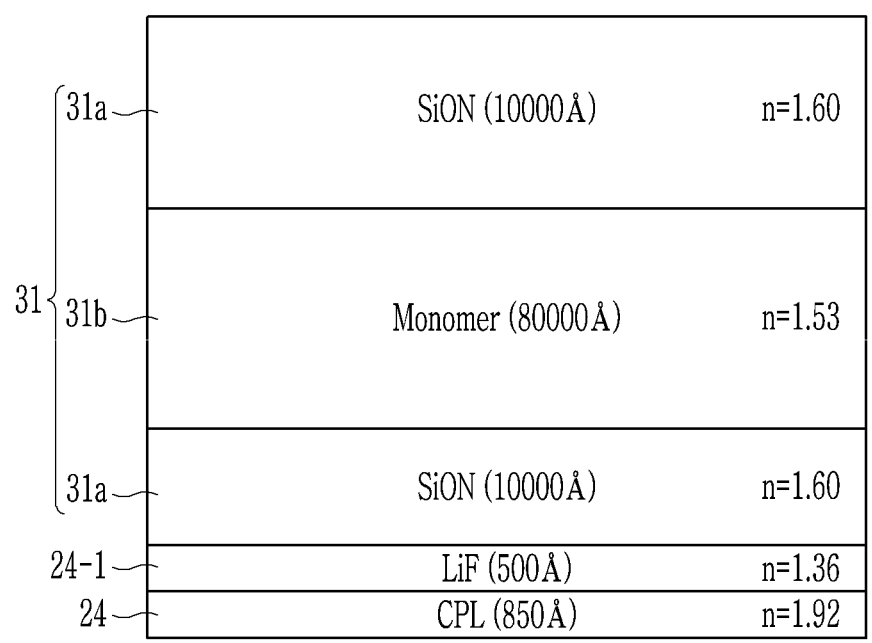

FIGS. 13, 14, and 15 are cross-sectional views showing various stacked structure of an encapsulation layer according to some exemplary embodiments.

First, the stacked structure of the encapsulation layer 31 will be described in association with FIG. 13.

FIG. 13 includes an intermediate layer 24-1 containing the common film organic passivation layer 24, which is the capping layer under the encapsulation layer 31, and a lithium fluoride (LiF). When the intermediate layer 24-1 using the lithium fluoride (LiF) is disposed adjacent to the electrode, it may perform the function of the electron injection layer.

The encapsulation layer 31 disposed on the intermediate layer 24-1 includes a first encapsulation layer 31a formed of the inorganic material, a second encapsulation layer 31b formed of the organic material, and a third encapsulation layer 31c formed of the inorganic material.

The first encapsulation layer 31a according to the exemplary embodiments described in association with FIG. 13 is formed of the silicon nitride layer of a SiON, the second encapsulation layer 31b is formed of a monomer (MN), and the third encapsulation layer 31c is formed of the silicon nitride layer of a $SiN_x$.

FIG. 13 shows the refractive index and the thickness of each layer, and each layer has a large difference in refractive index between the layers, resulting in loss of light at each boundary surface. When using the encapsulation layer 31 as shown in FIG. 13, the loss of the light is generated such that the transmittance of the light-transmitting area 210 may be reduced. However, even if the encapsulation layer 31 of FIG. 13 is used, the transmittance of the light-transmitting area 210 may be maintained above a predetermined level, so the encapsulation layer 31 of FIG. 13 is also an applicable structure.

A structure that further enhances the light transmittance of the encapsulation layer 31 itself is described with reference to FIGS. 14 and 15.

First, FIG. 14 is described. FIG. 14 shows an exemplary embodiment adding a refractive index buffer layer 31d between the layers of the encapsulation layer 31.

That is, the refractive index buffer layer 31d is added on the first encapsulation layer 31a, the second encapsulation layer 31b is formed thereon, the refractive index buffer layer 31d is again formed thereon, and the third encapsulation layer 31c is formed thereon.

FIG. 14 shows the structure in which an adhesive layer 40 is formed on the encapsulation layer 31; however, since the refractive index is also large between the third encapsulation layer 31c and the adhesive layer 40, the refractive index buffer layer 31d is also formed on the third encapsulation layer 31c.

The refractive index buffer layer 31d is formed of the silicon nitride layer including the SiON, and has a refractive index of about 1.6 to 1.7, thereby having a low reflection (anti-reflection) characteristic.

When the difference in refractive index between adjacent layers is set to 0.2 or less, the transmittance of the light-transmitting area 210 may be maintained high. According to some exemplary embodiments, the difference in refractive indexes between the adjacent layers may be set to 0.3 to 0.5.

Hereinafter, some exemplary embodiments will be described in association with FIG. 15.

The encapsulation layer 31 shown in FIG. 15 shows the structure in which the first encapsulation layer 31a is again formed on the second encapsulation layer 31b instead of forming the third encapsulation layer 31c as compared to FIG. 13. Also, the first encapsulation layer 31a uses the silicon nitride layer of the SiON with a low refractive index, thereby having a refractive index of 1.6. In the exemplary embodiments described in association with FIG. 13, considering the refractive index of the first encapsulation layer 31a being 1.78, it may be confirmed that the refractive index decreases. As a result, it is almost the same as the refractive index of the second encapsulation layer 31b of 1.53, accordingly reducing the loss of the light in the boundary surface.

Figure 16:
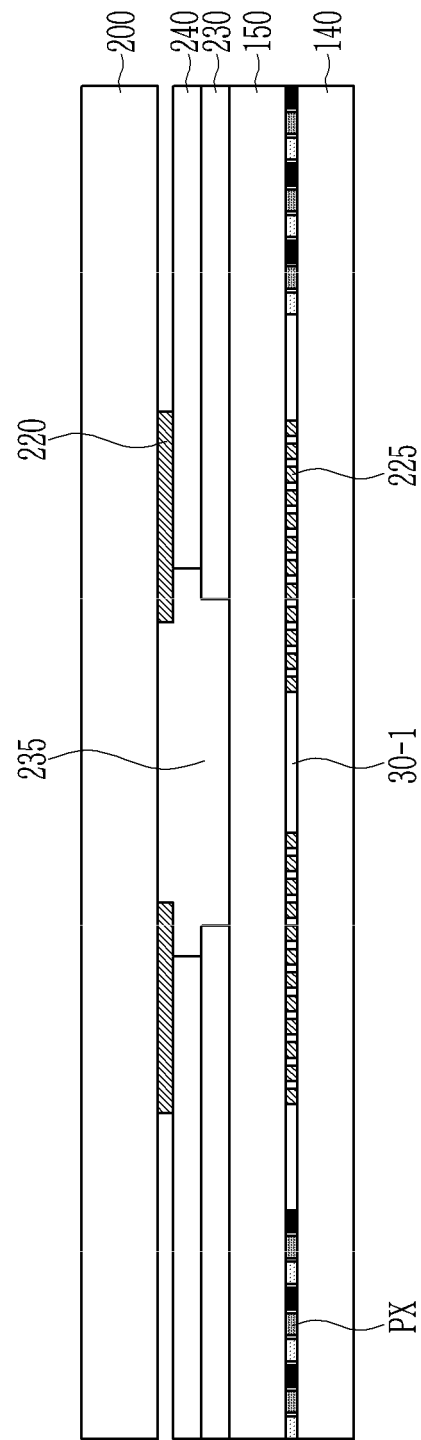
FIGS. 16, 17, and 18 are cross-sectional views of various display panels according to some exemplary embodiments.
Figure 17:
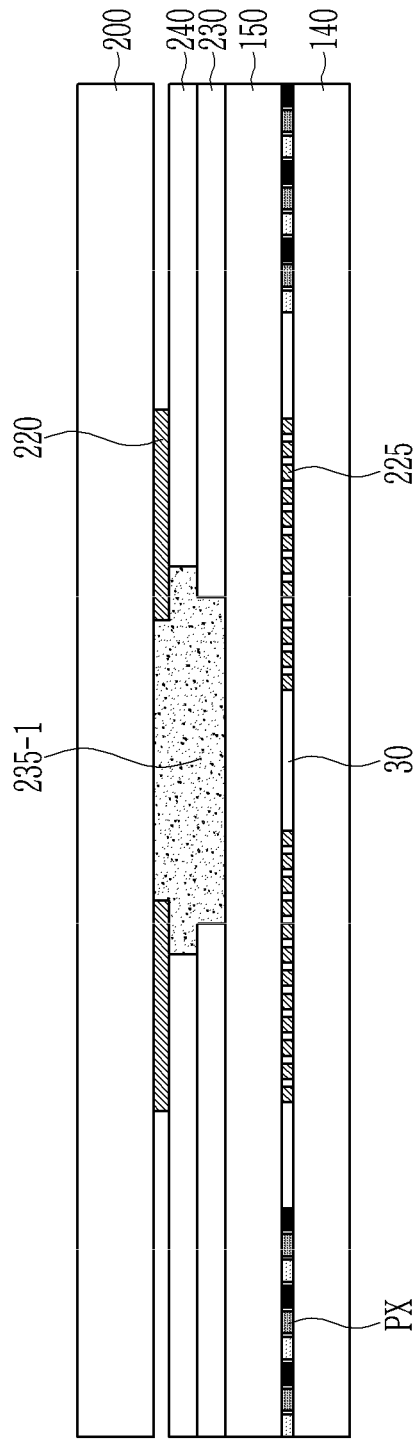
Figure 18:
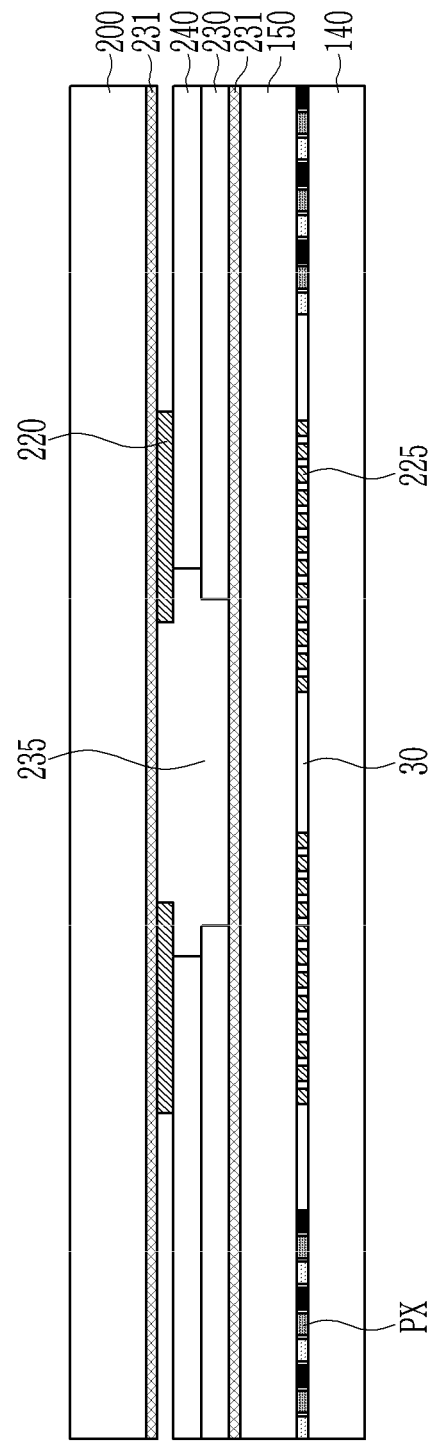

Next, exemplary variations of the display panel are described with reference to FIGS. 16 to 18. FIGS. 16 to 18 are exemplary embodiments improving the transmittance by changing the air layer, such as air layers 30 and 235.

FIGS. 16, 17, and 18 are cross-sectional views of various display panels according to some exemplary embodiments.

First, FIG. 16 is described. The structure of FIG. 16 is almost the same as the structure of FIG. 10. The only difference is that the air layer 30 in FIG. 10 filled with the filling material is replaced with a filling layer 30-1. The filling material may be various filling materials depending on the layered relationship between the upper and lower layers. The filling material may use the silicon (Si)-based organic material.

Further, the exemplary embodiment of FIG. 17 is almost the same as the structure of FIG. 10. The exemplary embodiment of FIG. 17 is one in which the air layer 235 disposed upward in the structure of FIG. 10 is changed to a filling layer 235-1 filled with the filling material. The filling material used in FIG. 16 and the filling material used in FIG. 17 may be different from each other owing to the filling material possibly being varied depending on the refractive index of the layer in contact with the two filling layers 30-1 and 235-1.

Next, the exemplary embodiment of FIG. 18 is described.

The exemplary embodiment described in association with FIG. 18 is also a base structure of the exemplary embodiments described in association with FIG. 10, and is added with a pair of low reflection layers 231 (the anti-reflection layers).

The low reflection layers 231 may be formed by coating the anti-reflection material, and the anti-reflection material may be coated on the inner surface of the window 200 and the upper surface of the upper glass substrate 150. The loss of the light is reduced in the boundary surface of the upper glass substrate 150 and the air layer 235 due to the low reflection layers 231 in the light-transmitting area 210, and the loss of the light is reduced in the boundary surface of the air layer 235 and the window 200, thereby improving the light transmittance.

Next, exemplary embodiments changing the position of the light-transmitting area 210 is described with reference to FIG. 19.

FIG. 19 is a top plan view of a display panel according to an exemplary embodiment.

FIG. 19 is the structure in which the light-transmitting area 210 is disposed in the opened region of the display area 100, not the structure in which the light-transmitting area 210 is enclosed by the display area 100 as compared with FIG. 1. That is, FIG. 19 shows the structure in which the display area 100 partially encloses the light-transmitting area 210. As a result, the light-transmitting area 210 is in direct contact with the outer buffer area 201.

The outer buffer area 201 of FIG. 19 encloses the light-transmitting area 210 and the display area 100. Also, the outer buffer area 201 partially extends between the display area 100 and the light-transmitting area 210, thereby having the structure separating the display area 100 and the light-transmitting area 210 from each other.

FIGS. 1 and 19 show the light-transmitting area 210 above the display panel; however, it may be formed at different positions.

Next, a method of easily removing the upper electrode (the cathode; common film upper electrode 23) from the light-transmitting area 210 is described with reference to FIGS. 20 and 21.

Figure 20:
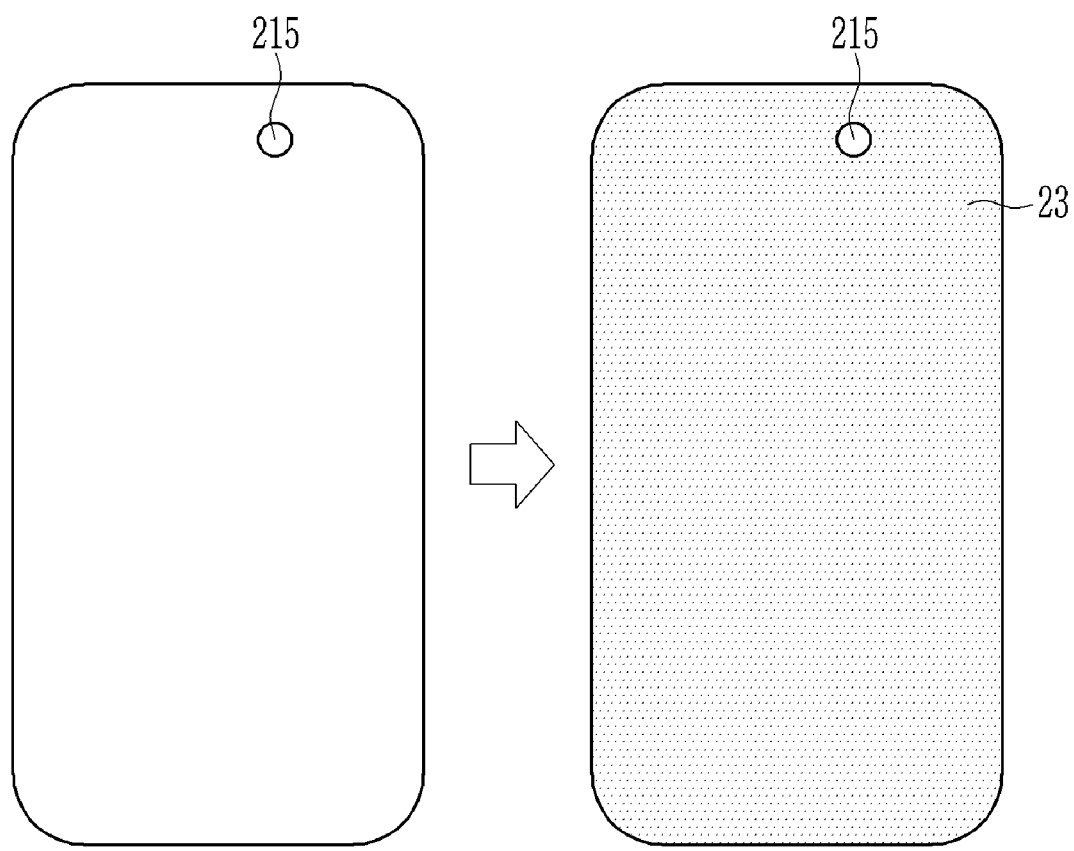
FIGS. 20 and 21 are views showing a method of forming a light-transmitting area in a display panel according to an exemplary embodiment.
Figure 21:
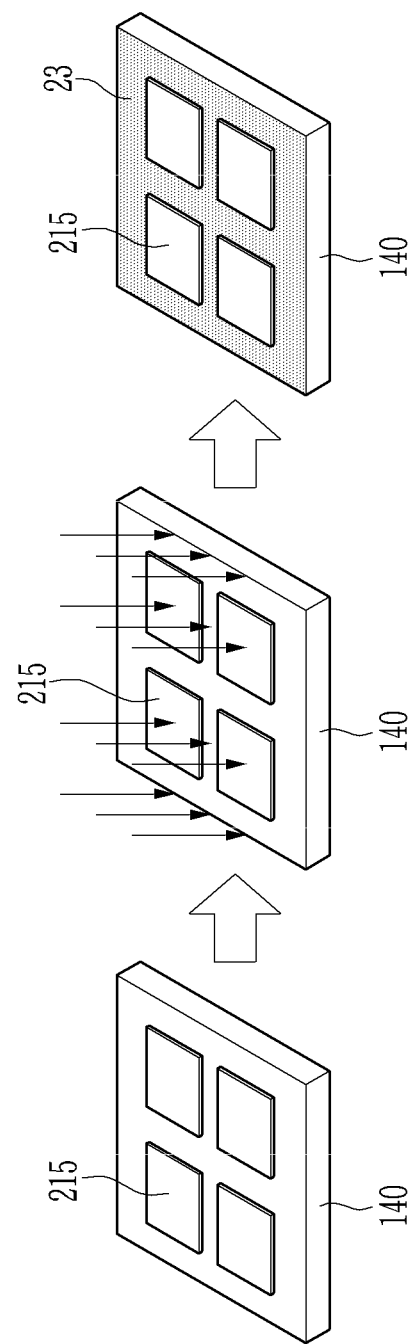

FIGS. 20 and 21 are views showing a method of forming a light-transmitting area in a display panel according to an exemplary embodiment.

Referring to FIGS. 20 and 21, before forming the common film upper electrode 23, a low adhesive layer 215 is firstly formed at the position of the light-transmitting area 210 to be formed. The low adhesive layer 215 is formed of the electrode material to be used as the common film upper electrode 23 and the organic material having a low adhesion characteristic. Here, the used organic material may be formed using a material such as 8-quinolinato lithium (Liq; [8-quinolinolato lithium]), N,N-diphenyl-N,N-bis(9-phenyl-9H-carbazole-3-ylbiphenyl-4,4'-diamine (HT01), N(diphenyl-4-yl9,9-dimethyl-N-(4(9-phenyl-9H-carbazole-3-ylphenyl)-9H-fluorene-2-amine (HT211), 2-(4-(9,10-di(naphthalene-2-ylanthracene-2-ylphenyl)-1-phenyl-1H-benzo-[D]imidazole (LG201), etc.

Next, if a metal material including magnesium (Mg) as a metal for the common film upper electrode 23 is formed on the entire region, the material for the common film upper electrode 23 formed at the portion where the low adhesive layer 215 is located is separated, and then the common film upper electrode 23 is not formed at the corresponding position. The metal material including magnesium (Mg) may be a metal material including aluminum (Al) along with magnesium (Mg). Also, the material for the common film upper electrode 23 may be variously formed. That is, the material for the common film upper electrode 23 may be formed of a metal having low work function, that is, Ag, Mg, Al, Pt, Pd, Au, Ni, Nd, Ir, Cr, Li, Ca, etc.

This method has a merit that it does not require a separate patterning process.

On the other hand, according to some exemplary embodiments, at the position where the common film upper electrode 23 is formed, at least one material selected from a group including aluminum (Al), silver (Ag), and alloys of magnesium and silver (Mg:Ag) may be previously formed. Next, the low adhesive layer 215 may be formed of the organic layer having the low adhesion characteristic and the material for the common film upper electrode 23 may be entirely formed thereon. As above-described, if the material for the common film upper electrode 23 and the layer having a good adhesion characteristic are previously formed, it is possible to pattern the common film upper electrode 23 more precisely because the adhesion is improved at the portion except at the low adhesive layer 215 having a low adhesion characteristic.

FIG. 21 further generally shows the method shown in FIG. 20.

Since the display area 100 is disposed about the light-transmitting area 210 in the display panel, wiring (a gate line, a data line) must be connected. However, in order to increase the transparency of the light-transmitting area 210, the wiring (gate line, data line) should be formed so as not to pass through the light-transmitting area 210.

Figure 22A:
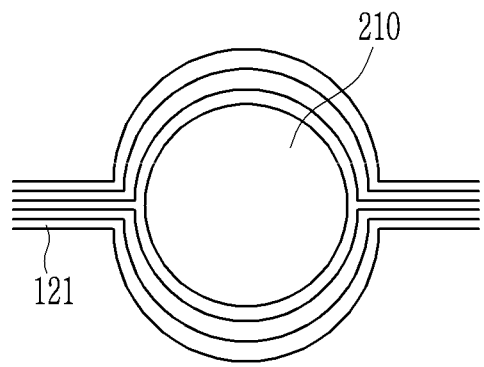
FIGS. 22A and 22B are views simply showing wiring disposed in a peripheral portion of a light-transmitting area according to some exemplary embodiments.
Figure 22B:
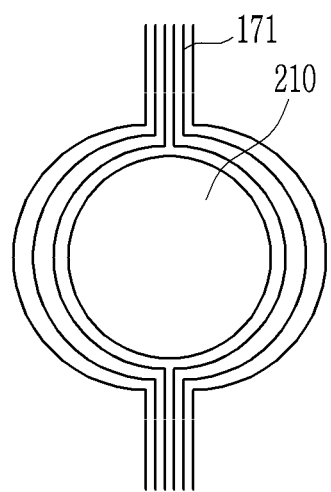

For this purpose, it is preferable that the wiring (gate line, data line) is formed as shown in FIGS. 22A and 22B.

FIGS. 22A and 22B are views simply showing wiring disposed in a peripheral portion of a light-transmitting area according to some exemplary embodiments.

FIG. 22A shows the structure in which a gate line 121 extends along the periphery of the light-transmitting area 210, and FIG. 22B shows the structure in which a data line 171 extends along the periphery of the light-transmitting area 210. In FIGS. 22A and 22B, the wiring (gate line 121, data line 171) has a semicircular structure, and bypasses the light-transmitting area 210. Although FIGS. 22A and 22B show exemplary embodiments in which the wiring (the gate line 121, the data line 171) is formed of a single layer according to some exemplary embodiments, it is possible for the wiring (gate line 121, data line 171) to have a structure connected by using a connection portion disposed at a different layer.

Glass substrates are used for the lower and upper glass substrates 140 and 150 in all of the exemplary embodiments previously described. However, it is possible to use a plastic substrate, such as polyimide (PI) or the like, according to some exemplary embodiments. In this case, the display panel may have a flexible characteristic. When a plastic substrate is used, a layered structure suitable for the substrate may be realized based on the refractive index of the material of the plastic substrate.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display device comprising:
a display panel comprising a lower substrate and an upper substrate, the display panel forming a light-transmitting area and a display area near the light-transmitting area;
an optical member adjacent to a rear surface of the display panel and overlapping with a portion corresponding to the light-transmitting area; and
at least one of an air layer filled with air comprising nitrogen and a filling layer filled with a silicon-based organic material, the at least one of the air layer and the filling layer being disposed between the upper substrate and the lower substrate,
wherein:
the display area comprises a thin film transistor and an organic light emitting element configured to receive a current from the thin film transistor;
the light-transmitting area does not include a metal layer, which is disposed in the display area; and
the upper substrate and the lower substrate do not have a through-hole structure in the light-transmitting area.

2. The display device of claim 1, wherein the display area comprises a thin film transistor (TFT) insulating layer, a TFT organic layer, an upper electrode, and an organic passivation layer.

3. The display device of claim 2, wherein:
the TFT insulating layer comprises a buffer layer, a gate insulating layer, and an interlayer insulating layer; and
two layers among the buffer layer, the gate insulating layer, and the interlayer insulating layer extend into and contact one another in the light-transmitting area, the two layers comprising a same material, the same material being a silicon oxide or a silicon nitride.

4. The display device of claim 2, wherein:
the TFT insulating layer comprises a buffer layer, a gate insulating layer, and an interlayer insulating layer;
at least two layers among the buffer layer, the gate insulating layer, and the interlayer insulating layer extend into the light-transmitting area; and
each of the at least two layers in the light-transmitting area are formed of only one of a silicon oxide and a silicon nitride.

5. The display device of claim 2, wherein:
the TFT organic layer extends into the light-transmitting area; and
the optical member is an infrared camera.

6. The display device of claim 1, wherein the display panel comprises:
a polarizer disposed on the upper substrate;
an adhesive layer disposed on the polarizer; and
a window disposed on the adhesive layer, the window comprising an upper light blocking layer comprising an opening corresponding to a portion of the light-transmitting area.

7. The display device of claim 6, wherein the polarizer is not formed in the light-transmitting area.

8. The display device of claim 7, further comprising:
a lower light blocking layer comprising an opening corresponding to a portion of the light-transmitting area between the upper substrate and the lower substrate, wherein the opening of the lower light blocking layer is narrower than the opening of the upper light blocking layer.

9. The display device of claim 1, wherein:
the display panel comprises:
  a color filter and an upper light blocking layer disposed on the upper substrate;
  an adhesive layer disposed on the color filter and the upper light blocking layer; and
  a window disposed on the adhesive layer, and
the upper light blocking layer comprises an opening corresponding to a portion of the light-transmitting area.

10. The display device of claim 9, further comprising:
a lower light blocking layer comprising an opening corresponding to a portion of the light-transmitting area between the upper substrate and the lower substrate,
wherein the opening of the lower light blocking layer is narrower than the opening of the upper light blocking layer.

11. The display device of claim 9, wherein
the at least one of the air layer and the filling layer is disposed between the window and the upper substrate.

12. The display device of claim 1, wherein, in a plan view, the light-transmitting area is enclosed by the display area.

13. The display device of claim 1, wherein:
the display panel further comprises an outer buffer area;
in a plan view, the outer buffer area encloses the light-transmitting area and the display area;
in the plan view, the light-transmitting area is partially enclosed by the display area; and
part of the outer buffer area extends to between the display area and the light-transmitting area to separate the display area and the light-transmitting area from each other.

14. A display device comprising:
a display panel comprising a lower substrate and an upper substrate, the display panel forming a light-transmitting area and a display area near the light-transmitting area; and
an optical member adjacent to a rear surface of the display panel and overlapping with a portion corresponding to the light-transmitting area,
wherein:
the display area comprises a thin film transistor (TFT), an organic light emitting element configured to receive a current from the TFT, a TFT insulating layer, a TFT organic layer, an upper electrode, and an organic passivation layer;
the light-transmitting area does not include a metal layer, which is disposed in the display area; and
the upper substrate and the lower substrate do not have a through-hole structure in the light-transmitting area;
the TFT insulating layer comprises a buffer layer, a gate insulating layer, and an interlayer insulating layer; and
only one layer among the buffer layer, the gate insulating layer, and the interlayer insulating layer extends into the light-transmitting area.

15. A display device comprising:
a display panel comprising a light-transmitting area and a display area near the light-transmitting area; and
an infrared camera adjacent to a rear surface of the display panel and overlapping with a portion corresponding to the light-transmitting area,
wherein:
the display area comprises a thin film transistor, a thin film transistor (TFT) organic layer, and an organic light emitting element configured to receive a current from the thin film transistor;
the organic light emitting element comprises a pixel electrode, an organic emission layer, and an upper electrode;
the light-transmitting area does not include either of the upper electrode and a metal layer disposed in the display area, and
the TFT organic layer extends into the light-transmitting area.

16. The display device of claim 15, wherein the display panel further comprises an encapsulation layer covering the thin film transistor and the organic light emitting element, the encapsulation layer being configured to prevent moisture from permeating into the organic emission layer.

17. The display device of claim 16, wherein the encapsulation layer comprises:
a first encapsulation layer formed of a silicon nitride;
a second encapsulation layer disposed on the first encapsulation layer, the second encapsulation layer being formed of an organic material; and
a third encapsulation layer disposed on the second encapsulation layer, the third encapsulation layer being formed of a silicon nitride.

18. The display device of claim 17, wherein:
the encapsulation layer further comprises a refractive index buffer layer formed of a silicon nitride, the silicon nitride comprising a silicon oxynitride; and
the refractive index buffer layer is disposed between the first encapsulation layer and the second encapsulation layer, or between the second encapsulation layer and the third encapsulation layer.

19. The display device of claim 17, wherein the third encapsulation layer is formed of a silicon nitride comprising a silicon oxynitride having a refractive index less than 2.

* * * * *